(12) United States Patent
Kato et al.

(10) Patent No.: US 8,599,965 B2
(45) Date of Patent: Dec. 3, 2013

(54) WIRELESS COMMUNICATION APPARATUS

(75) Inventors: Akira Kato, Osaka (JP); Kaoru Ishida, Kanagawa (JP)

(73) Assignee: Panasonic Corporation, Osaka (JP)

( * ) Notice: Subject to any disclaimer, the term of this patent is extended or adjusted under 35 U.S.C. 154(b) by 170 days.

(21) Appl. No.: 13/388,495

(22) PCT Filed: Apr. 7, 2010

(86) PCT No.: PCT/JP2010/002547
§ 371 (c)(1),
(2), (4) Date: Feb. 2, 2012

(87) PCT Pub. No.: WO2011/016163
PCT Pub. Date: Feb. 10, 2011

(65) Prior Publication Data
US 2012/0140852 A1     Jun. 7, 2012

(30) Foreign Application Priority Data
Aug. 6, 2009    (JP) ................................ 2009-183584

(51) Int. Cl.
*H03C 1/52*      (2006.01)

(52) U.S. Cl.
USPC ........... 375/300; 375/259; 375/295; 375/298; 375/302; 375/307

(58) Field of Classification Search
USPC ......... 375/259, 261, 268, 271, 295, 297, 298, 375/300, 302, 307, 316
See application file for complete search history.

(56) References Cited

U.S. PATENT DOCUMENTS 7,521,974 B2 * 4/2009 Kirschenmann .............. 327/156
7,532,679 B2 * 5/2009 Staszewski et al. ........... 375/295
7,715,802 B2 * 5/2010 Yoshida et al. ................. 455/76
7,982,510 B2 * 7/2011 Casagrande ................... 327/157
8,010,063 B2 * 8/2011 Mow et al. ..................... 455/102
8,188,778 B2 * 5/2012 Shanan ......................... 327/157
8,260,222 B2 * 9/2012 Husted et al. .............. 455/115.1
8,463,189 B2 * 6/2013 Bashir et al. ................. 455/63.1

(Continued)

FOREIGN PATENT DOCUMENTS

| JP | 2004-48703 | 2/2004 |
| JP | 3979237 | 7/2007 |
| JP | 2009-17028 | 1/2009 |
| WO | 2008/044284 | 4/2008 |

OTHER PUBLICATIONS

International Search Report issued May 11, 2010 in corresponding International Application No. PCT/JP2010/002547.

*Primary Examiner* — Hirdepal Singh
(74) *Attorney, Agent, or Firm* — Wenderoth, Lind & Ponack, L.L.P.

(57) ABSTRACT

A transmitter circuit includes a first synthesizer section, and a second synthesizer section which consumes less current than the first synthesizer section. The transmitter circuit performs switching such that the first synthesizer section is operated and the second synthesizer section is powered off in polar modulation, and the second synthesizer section is operated and the first synthesizer section is powered off in quadrature modulation, thereby reducing consumed power. While the first synthesizer section is operating, calibration for an oscillation frequency is performed, and when the operation is stopped, a calibration value is stored. When an operation of the first synthesizer section is restarted, the stored calibration value is corrected by using temperature change, thereby enhancing calibration accuracy and preventing degradation in quality of a transmission signal.

10 Claims, 18 Drawing Sheets

(56) References Cited

U.S. PATENT DOCUMENTS

| | | |
|---|---|---|
| 8,509,363 B2* | 8/2013 | Shi et al. .................. 375/344 |
| 2004/0036530 A1 | 2/2004 | Matsuura et al. |
| 2004/0071225 A1 | 4/2004 | Suzuki et al. |
| 2005/0190854 A1* | 9/2005 | Shakeshaft et al. .......... 375/295 |
| 2006/0126365 A1* | 6/2006 | Chou et al. .................. 363/17 |
| 2007/0298732 A1* | 12/2007 | Lee et al. .................... 455/102 |
| 2009/0011723 A1 | 1/2009 | Inamori et al. |

* cited by examiner

FIG. 11

| TEMPERATURE CHANGE AMOUNT / FREQUENCY | Δ1°C | Δ-1°C |
|---|---|---|
| Freq1 | Comp_PVal1 | Comp_NVal1 |
| Freq2 | Comp_PVal2 | Comp_NVal2 |
| ... | ... | ... |
| FreqN | Comp_PVal3 | Comp_NVal3 |

WIRELESS COMMUNICATION APPARATUS

TECHNICAL FIELD

The present invention relates to configurations of transmitter circuits for use in wireless communication systems such as mobile telephones and wireless LANs. More specifically, the present invention relates to transmitter circuits that operate with reduced distortion and reduced current consumption.

BACKGROUND ART

As conventional transmitter circuits, for example, transmitter circuits (hereinafter, referred to as quadrature modulation circuits) that generate transmission signals by using a modulation mode such as a quadrature modulation have been known. The quadrature modulation circuits are well known and the description thereof is not given. Further, as conventional transmitter circuits each of which has a reduced size and operates with enhanced efficiency as compared to the quadrature modulation circuits, polar modulation circuits using a polar modulation mode have been known. In the polar modulation circuit, an inputted signal is separated into a phase component signal and an amplitude component signal, and amplification is performed to combine, by means of a saturated amplifier, a signal having a constant amplitude, which has been obtained by modulation using the phase component signal, with the amplitude component signal, thereby generating a transmission signal. In the polar modulation circuit, since an amplifier is operated in a saturated state, the transmission signal can be generated with a high power-efficiency in general.

Conventionally, a transmitter circuit has been suggested in which the polar modulation mode as described above is used for a high output, and the quadrature modulation mode is used for a low output, to obtain a high power-efficiency as a whole. For example, Patent Literature 1 discloses a transmitter circuit 600 as shown in FIG. 18. A configuration and an operation of the transmitter circuit will be described below.

An in-phase component signal (I signal) and a quadrature component signal (Q signal) which are signals for the quadrature mode are inputted to an interface section 602 from a baseband section 601. An Rθ transformation section 604 in the interface section 602 switches between the quadrature modulation mode and the polar modulation mode based on an AGC control signal from the baseband section 601. The Rθ transformation section 604 passes and outputs the I signal and the Q signal without performing signal processing, in the quadrature modulation mode, while performs a transformation process (Rθ transformation process) for transforming the I signal and the Q signal into an amplitude component signal and a phase component signal in the polar modulation mode. The Rθ transformation process is performed by extraction of phase information and envelop detection being performed by a limiter.

The I signal is inputted to a DAC 605 in the quadrature modulation mode, and the phase component signal is inputted to the DAC 605 in the polar modulation mode. Further, the Q signal is inputted to the DAC 606 in the quadrature modulation mode, and the amplitude component signal is inputted to the DAC 606 in the polar modulation mode. An output of the DAC 605 is inputted to a mixer 621 via a baseband filter 625.

A switch 607 operates so as to connect an output of the DAC 606 to a Q component baseband filter 608 of an RF-IC 603 in the quadrature modulation mode, and connect the output of the DAC 606 to an amplitude modulation circuit 609 in the polar modulation mode.

A switch 610 operates to connect a sum of the I signal and the Q signal to an AGC amplifier 611 in the quadrature modulation mode, and connect only the phase component signal to the AGC amplifier 611 in the polar modulation mode. A switch 612 operates to connect, in the quadrature modulation mode, an output of the AGC amplifier to an output buffer 613, and output the output of the AGC amplifier to a front-end section without passing the output through a power amplifier 614, while operates to connect, in the polar modulation mode, the output of the AGC amplifier to the power amplifier 614, to amplify the output.

In the quadrature modulation, the input signal is transformed into the I signal and the Q signal. An oscillation signal generated by an oscillator 620 is separated into two signals by a phase shifter 623. One of the signals is not subjected to phase shift, is outputted to a mixer 621, and is multiplied, in the mixer 621, by the I signal outputted from a baseband filter 625. The other of the signals is subjected to phase shift, and is thereafter outputted to a mixer 622, and is multiplied, in the mixer 622, by the Q signal outputted from a baseband filter 608. The signals obtained by multiplication by the I signal and multiplication by the Q signal, respectively, are then added by an adder 624, to obtain a modulated wave for the quadrature modulation mode. On the other hand, in the polar modulation, the input signal is transformed into the amplitude component signal and the phase component signal. The oscillation signal generated by the oscillator 620 is firstly multiplied by the phase component signal, to generate a phase-modulated signal. Thereafter, the phase-modulated signal is amplified and combined with the amplitude component signal by the power amplifier 614, to obtain a modulated wave for the polar modulation mode. Namely, the transmitter circuit switches the modulation mode such that the quadrature modulation is performed when a voltage level of a signal is lower than a predetermined value, and the polar modulation is performed when the voltage level of the signal is higher than the predetermined value. Thus, the conventional transmitter circuit uses the quadrature modulation mode and the polar modulation mode in combination, thereby realizing reduction of power consumption.

CITATION LIST

Patent Literature

Patent Literature 1: Japanese Patent No. 3979237

SUMMARY OF THE INVENTION

Problems to be Solved by the Invention

In general, a VCO (voltage-controlled oscillator) used as an oscillator has a characteristic that, when a supplied current is changed, an output frequency also fluctuates, and the frequency does not converge for a certain time period. Therefore, in the conventional transmitter circuit 600, in order to prevent degradation in quality of a transmission signal, it is necessary to maintain a current supplied to the VCO so as to be constant and to prevent fluctuation of an oscillation frequency, during operation. The current supplied to the VCO needs to be maintained in a high level state according to the polar modulation in which a high output is required. Therefore, the current supplied to the VCO cannot be reduced even in the quadrature modulation in which the output level may be low, so that enhancement of power efficiency for the transmitter circuit has been inhibited.

Further, for example, an amplifier section of the transmitter circuit has a characteristic that a signal delay occurs depending on a temperature, and a delay occurs between the amplitude component signal and the phase component signal that are transmitted through different paths, respectively, so that a problem arises that a quality of a transmission signal is degraded in the polar modulation.

Moreover, the amplifier section of the transmitter circuit has an offset characteristic depending on a temperature, and an output voltage cannot be obtained from the amplifier section in a range in which a voltage level of the amplitude component signal as an input signal is low, so that a problem arises that a quality of a transmission signal is degraded.

Therefore, an object of the present invention is to enable, in the quadrature modulation, switching to a VCO that operates with low current to be performed, thereby improving power efficiency of a transmitter circuit, and preventing degradation in quality of a transmission signal.

Solution to the Problems

In order to attain the aforementioned object, one aspect of the present invention is directed to a transmitter circuit that implements two modulation modes which are a polar modulation mode and a quadrature modulation mode, switches between the modulation modes according to an instruction, and generates a transmission signal, and the transmitter circuit includes: a signal generation section for transforming input data into an amplitude component signal and a phase component signal in the polar modulation mode, and transforming the input data into an in-phase component signal and a quadrature component signal in the quadrature modulation mode, to output an obtained signal; a first synthesizer section having a first VCO; a second synthesizer section having a second VCO that consumes less current than the first VCO; a mixer section; and an amplifier section. The transmitter circuit operates in at least a first operation state, a second operation state, and a third operation state. In the first operation state, a modulation is performed in the polar modulation mode such that the first synthesizer section generates a phase-modulated signal based on the phase component signal, and the amplifier section performs amplification to combine the phase-modulated signal with the amplitude component signal, to generate the transmission signal. In the second operation state, a modulation is performed in the quadrature modulation mode such that the first synthesizer section generates a carrier wave, and the mixer section generates the transmission signal from the carrier wave, the in-phase component signal, and the quadrature component signal. In the third operation state, a modulation is performed in the quadrature modulation mode such that the second synthesizer section generates the carrier wave, and the mixer section generates the transmission signal from the carrier wave, the in-phase component signal, and the quadrature component signal. When an instruction for switching to a quadrature modulation is received in the first operation state, the transmitter circuit shifts to the second operation state, and the second synthesizer section is powered on, and after a predetermined time period has elapsed, the transmitter circuit shifts to the third operation state, and the first synthesizer section is powered off. When an instruction for switching to a polar modulation is received in the third operation state, the first synthesizer section is powered on, and after a predetermined time period has elapsed, the transmitter circuit shifts to the first operation state, and the second synthesizer section is powered off.

Further, the transmitter circuit of the present invention further includes: a first temperature calibration section for performing a first temperature calibration; and a first temperature sensor. The first temperature calibration section stores a calibration value when the first temperature calibration is set to be off. The first temperature calibration section starts the first temperature calibration based on the stored calibration value when the first temperature calibration is set to be on.

Further, in the transmitter circuit of the present invention, when the first temperature calibration is set to be on, the first temperature calibration section calculates a new calibration value based on the stored calibration value, and a temperature change which is measured by the first temperature sensor while the first temperature calibration is off, and the first temperature calibration section starts the first temperature calibration based on the new calibration value.

Further, in the transmitter circuit of the present invention, the first temperature calibration is a temperature calibration for a voltage supplied to a VCO. The first temperature calibration section monitors, while the first VCO is operating, an oscillation frequency of the first VCO, and calibrates the supplied voltage, in order to stabilize the oscillation frequency. The first temperature calibration section sets, when the first synthesizer section is powered off, the first temperature calibration to be off, and stores the calibration value for the voltage supplied to the first VCO. The first temperature calibration section sets, when the first synthesizer section is powered on, the first temperature calibration to be on, and starts a calibration for the voltage supplied to the first VCO by using the stored calibration value.

Furthermore, in the transmitter circuit of the present invention, the first temperature calibration is a temperature calibration for a voltage supplied to a VCO. The first temperature calibration section monitors, while the first VCO is operating, an oscillation frequency of the first VCO, and calibrates the supplied voltage, in order to stabilize the oscillation frequency. The first temperature calibration section sets, when the first synthesizer section is powered off, the first temperature calibration to be off, and stores a calibration value of the voltage supplied to the first VCO. When the first synthesizer section is powered on, the first temperature calibration section calculates the new calibration value based on the stored calibration value, and the temperature change in the first VCO which is measured by the first temperature sensor while the first synthesizer section is powered off, and starts a calibration for the voltage supplied to the first VCO based on the new calibration value.

Moreover, in the transmitter circuit of the present invention, when an instruction for switching to the polar modulation is received in the second operation state, the transmitter circuit returns to the first operation state without shifting to the third operation state. In a case where, after an instruction for switching to the polar modulation has been received in the third operation state and before the transmitter circuit shifts to the first operation state, an instruction for switching to the quadrature modulation is received, the transmitter circuit remains in the third operation state without shifting to the first operation state.

Furthermore, the transmitter circuit of the present invention further includes: a second temperature calibration section for performing a second temperature calibration; and a second temperature sensor. The second temperature calibration is a temperature calibration for a signal delay in the amplifier section. The second temperature calibration section calculates a signal delay calibration value used in the calibration for the signal delay in the amplifier section, based on a temperature of the amplifier section, which is measured by the second temperature sensor, and the second temperature calibration section delays at least one of the amplitude component signal and the phase component signal based on the signal delay calibration value, and the second temperature calibration is set to be on in the case of modulation being performed in the polar modulation mode, and the second temperature calibration is set to be off in the case of modulation being performed in the quadrature modulation mode. When the second temperature calibration is shifted from an off-state to an on-state, a new calibration value is calculated based on a temperature change which is measured by the second temperature sensor while the second temperature calibration is off, and the second temperature calibration is started based on the new calibration value.

Furthermore, the transmitter circuit of the present invention further includes: a third temperature calibration section for performing a third temperature calibration; and a third temperature sensor. The third temperature calibration is a temperature calibration for an offset characteristic of the amplifier section. The third temperature calibration section calculates an offset calibration value used in the calibration for the offset characteristic of the amplifier section, based on a temperature of the amplifier section, which is measured by the third temperature sensor, and the third temperature calibration section calibrates a voltage of the amplitude component signal based on the offset calibration value, and the third temperature calibration is set to be on in the case of modulation being performed in the polar modulation mode, and the third temperature calibration is set to be off in the case of modulation being performed in the quadrature modulation mode. When the third temperature calibration is shifted from an off-state to an on-state, a new calibration value is calculated based on a temperature change which is measured by the third temperature sensor while the third temperature calibration is off, and the third temperature calibration is started based on the new calibration value.

Another aspect of the present invention is directed to a communication apparatus that includes: a transmitter circuit as described above; and an antenna for outputting the transmission signal generated in the transmitter circuit.

Further, the communication apparatus of the present invention further includes: a receiver circuit for processing a reception signal received via the antenna; and an antenna duplexer for outputting, to the antenna, the transmission signal generated in the transmitter circuit, and outputting, to the receiver circuit, the reception signal received via the antenna.

Advantageous Effects of the Invention

According to the present invention, the transmitter circuit enables switching to a VCO operating with low current in the quadrature modulation, thereby enabling enhancement of power efficiency. Further, a stable oscillation signal can be also obtained immediately after switching to the polar modulation mode, thereby preventing degradation in quality of the transmission signal.

BRIEF DESCRIPTION OF THE DRAWINGS

FIG. 11 illustrates an exemplary table which is stored in a LUT of the transmitter circuit according to the first embodiment of the present invention.

DESCRIPTION OF EMBODIMENTS

First Embodiment

Figure 1:
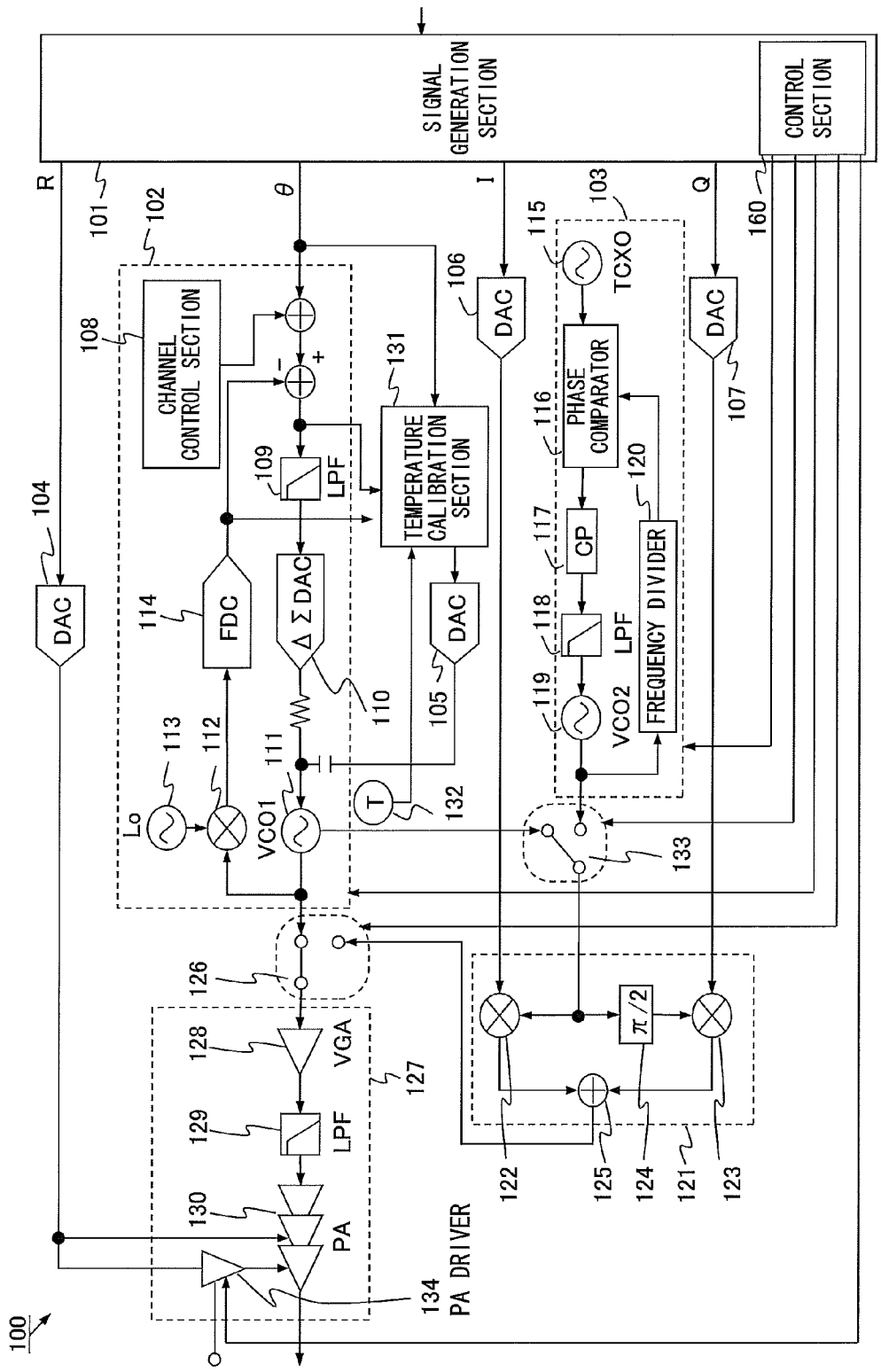
FIG. 1 illustrates a transmitter circuit according to a first embodiment of the present invention.

A first embodiment of the present invention will be described below. FIG. 1 illustrates a configuration of a transmitter circuit 100 according to the present embodiment. The transmitter circuit 100 includes: a signal generation section 101, first and second synthesizer sections 102 and 103; a mixer section 121; a first temperature calibration section 131; a first temperature sensor 132; and an amplifier section 127. An input to the transmitter circuit 100 contains input data which has yet to be modulated, and an instruction signal representing a criterion for switching a modulation mode. To the signal generation section 101, the input data and the instruction signal are inputted. The signal generation section 101 includes a control section 160. The control section 160 determines, based on the instruction signal, whether modulation is to be performed in the quadrature modulation mode or the polar modulation mode. An exemplary determination process performed by the control section 160 based on the instruction signal will be described below. The signal generation section 101 transforms the input data into signals based on the modulation mode determined by the control section 160.

Namely, the signal generation section 101 transforms the input data into an I signal and a Q signal in the quadrature modulation, and transforms the input data into an amplitude component signal and a phase component signal in the polar modulation. The amplitude component signal and the phase component signal are each a null signal in the quadrature modulation, and the I signal and the Q signal are each a null signal in the polar modulation. The I signal and the Q signal are inputted to the mixer section 121 via digital-analog converters (DACs) 106 and 107, respectively. The amplitude component signal is inputted to the amplifier section 127 via a DAC 104. The amplifier section 127 includes a VGA 128, an LPF 129, a power amplifier (PA) 130, and a PA driver 134. The PA driver 134 supplies a constant voltage to the power amplifier 130 in the quadrature modulation so as to enable the power amplifier 130 to linearly operate. Further, the PA driver 134 supplies the power amplifier 130 with a voltage based on the amplitude component signal in the polar modulation. Further, the phase component signal is inputted to the first synthesizer section 102 and the first temperature calibration section 131.

To the first synthesizer section 102, the phase component signal is inputted, and an output of the first temperature calibration section 131 is inputted via a DAC 105. The first temperature calibration section 131 acts so as to calibrate gain variation caused due to temperature change in a first VCO 111 of the first synthesizer section 102, and the details thereof will be described below. A channel control section 108 of the first synthesizer section 102 outputs a signal for controlling a frequency of a carrier wave. To the first VCO 111 of the first synthesizer section 102, the signal for controlling a frequency of a carrier wave, and the phase component signal are inputted via a low pass filter (LPF) 109 and a ΔΣDAC (ΔΣ digital-analog converter) 110, and a signal from the first temperature calibration section 131 is inputted via the DAC 105. The first VCO 111 generates, based on these signals, a carrier wave in the quadrature modulation, and generates a phase-modulated signal in the polar modulation, to generate an output of the first synthesizer section 102. The output is connected to the amplifier section 127 via a switch 126, and is connected to the mixer section 121 via a switch 133. The first synthesizer section 102 is provided with a feedback loop including a local oscillator 113, a mixer 112, and an FDC (frequency—digital converter) 114, and stabilizes an oscillation frequency of the first VCO 111. Further, error information representing an error of an oscillation frequency of the first VCO 111 is outputted from the first synthesizer section 102 to the first temperature calibration section 131.

The second synthesizer section 103 generates a carrier wave, based on an output from a TCXO (temperature compensated crystal oscillator) 115 included therein, by using a second VCO 119 which is similarly included therein. The carrier wave is connected to a mixer circuit via the switch 133 as an output of the second synthesizer section 103. The second synthesizer section 103 is provided with a feedback loop including a frequency divider 120, a phase comparator 116, a CP (charge pump) 117, and an LPF 118, and stabilizes an oscillation frequency of the second VCO 119.

When transmission is performed at a low output level, the quadrature modulation mode is used and the second synthesizer section 103 is mainly used. On the other hand, when transmission is performed at a high output level, the polar modulation mode is used, and the first synthesizer section 102 is used.

To the mixer section 121, an output from an oscillator of the first synthesizer section, or an output from the second synthesizer section is inputted according to a state of the switch 133. The mixer section 121 includes a phase shifter 124, mixers 122 and 123, and an adder 125, and generates a quadrature modulation signal from the inputted signal, the I signal, and the Q signal, and outputs the quadrature modulation signal to the amplifier section 127 via the switch 126, in the quadrature modulation.

To the amplifier section 127, the phase-modulated signal is inputted from the first VCO 111 of the first synthesizer section 102, or the quadrature modulation signal is inputted from the mixer section 121 according to a state of the switch 126. Further, to the amplifier section 127, the amplitude component signal is inputted via the DAC 104. The amplifier section 127 performs a linear amplification in the quadrature modulation, and performs an amplification to combine the phase-modulated signal with the amplitude-modulated signal in the saturated state in the polar modulation, to output a transmission signal.

The transmitter circuit 100 includes four DACs 104 to 107. The DAC 104 and the DAC 105 are used only for the polar modulation, and the DAC 106 and the DAC 107 are used only for the quadrature modulation. Therefore, for example, a circuit configuration may be used which includes a DAC that doubles as the DAC 104 and the DAC 106, and a DAC that doubles as the DAC 105 and the DAC 107.

A determination process performed by the control section 160 will be described. The transmitter circuit 100 switches between two modulation modes, that is, the quadrature modulation mode and the polar modulation mode, according to an instruction from the outside. Examples of the instruction from the outside include an instruction from a base station or the like. In a case where a communication apparatus including the transmitter circuit 100, and a base station communicate with each other, if a communication status is unfavorable and a level of reception from the communication apparatus is low, the base station issues, to the communication apparatus, an instruction for enhancing an output level of the transmission signal. On the other hand, in a case where a communication status is favorable and a level of reception is high, the base station issues an instruction for reducing an output level of the transmission signal. The communication apparatus transfers the instruction from the base station, as the instruction signal, to the transmitter circuit 100 included in the apparatus. The control section 160 determines whether the modulation is to be performed in the quadrature modulation mode or the polar modulation mode, based on the instruction signal. For example, when the base station requires an output level higher than a predetermined threshold value, it is determined that the modulation is to be performed in the polar modulation mode, and when the base station requires an output level lower than the predetermined threshold value, it is determined that the modulation is to be performed in the quadrature modulation mode.

An operation state of the transmitter circuit 100 is switched among the following three states according to whether the quadrature modulation mode is used or the polar modulation mode is used, and whether an output of the first synthesizer section or an output of the second synthesizer section is used for generating a transmission signal. Hereinafter, these states will be described with reference to FIGS. 2 to 4. In each of FIGS. 2 to 4, the configuration of the transmitter circuit 100 is schematically shown and simplified such that the signal generation section 101, the first synthesizer section 102, the second synthesizer section 103, the mixer section 121, the amplifier section 127, and the switches 126 and 133 are only indicated, and the first temperature calibration section 131, the DACs 104 to 107, the control section 160, and the like are not shown. Further, in each operation state, portions that contribute to generation of the transmission signal are indicated by solid lines, and portions that do not contribute to generation of the transmission signal are indicated by dashed lines.

Figure 2:
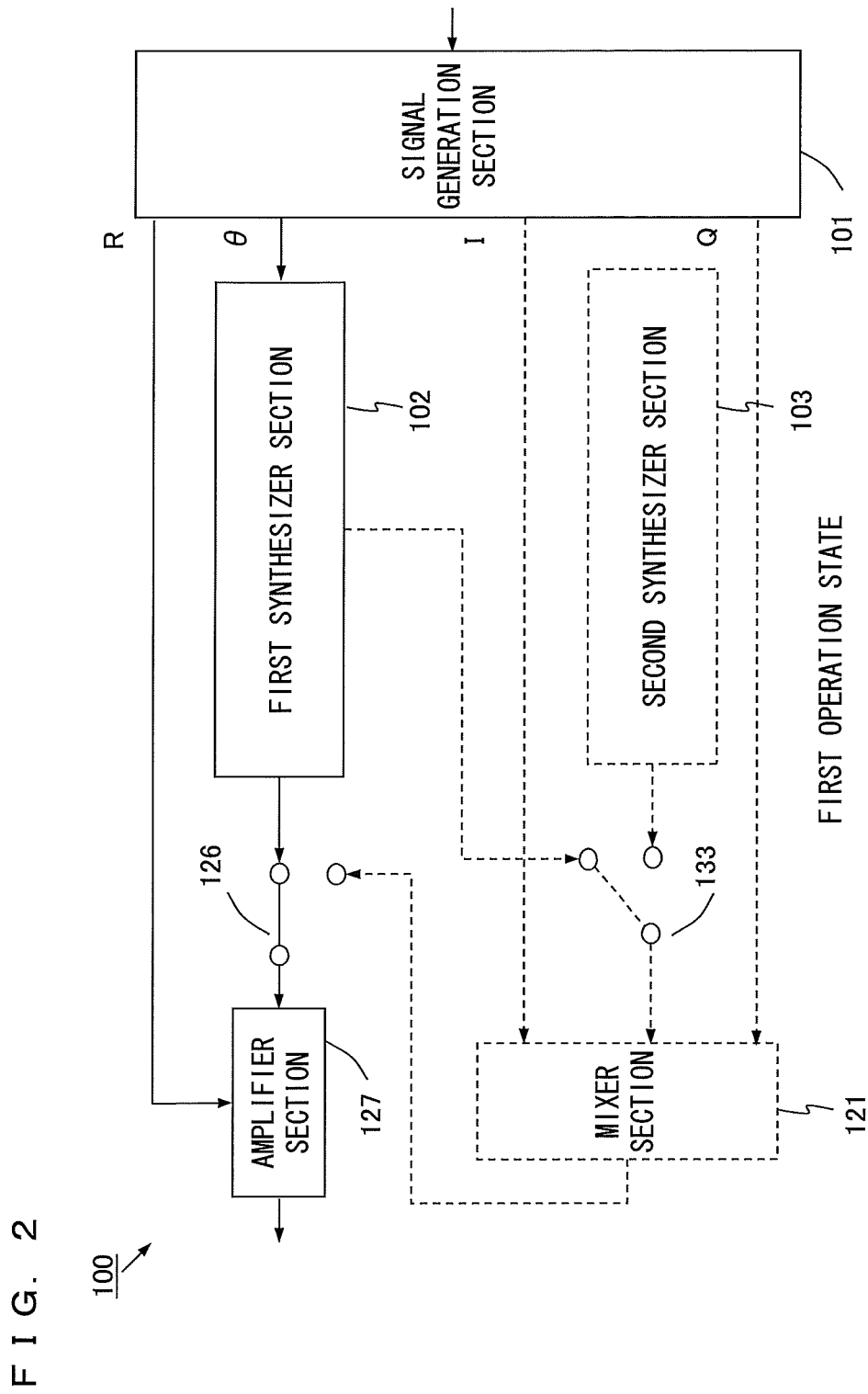
FIG. 2 illustrates a first operation state of the transmitter circuit according to the first embodiment of the present invention.

In the first operation state, the polar modulation is performed by using an output of the first synthesizer section 102. In this state, the signal generation section 101 outputs the amplitude component signal and the phase component signal. As shown in FIG. 2, the switch 126 is in such a state as to enable the output of the first synthesizer section 102 to be inputted to the amplifier section.

Figure 3:
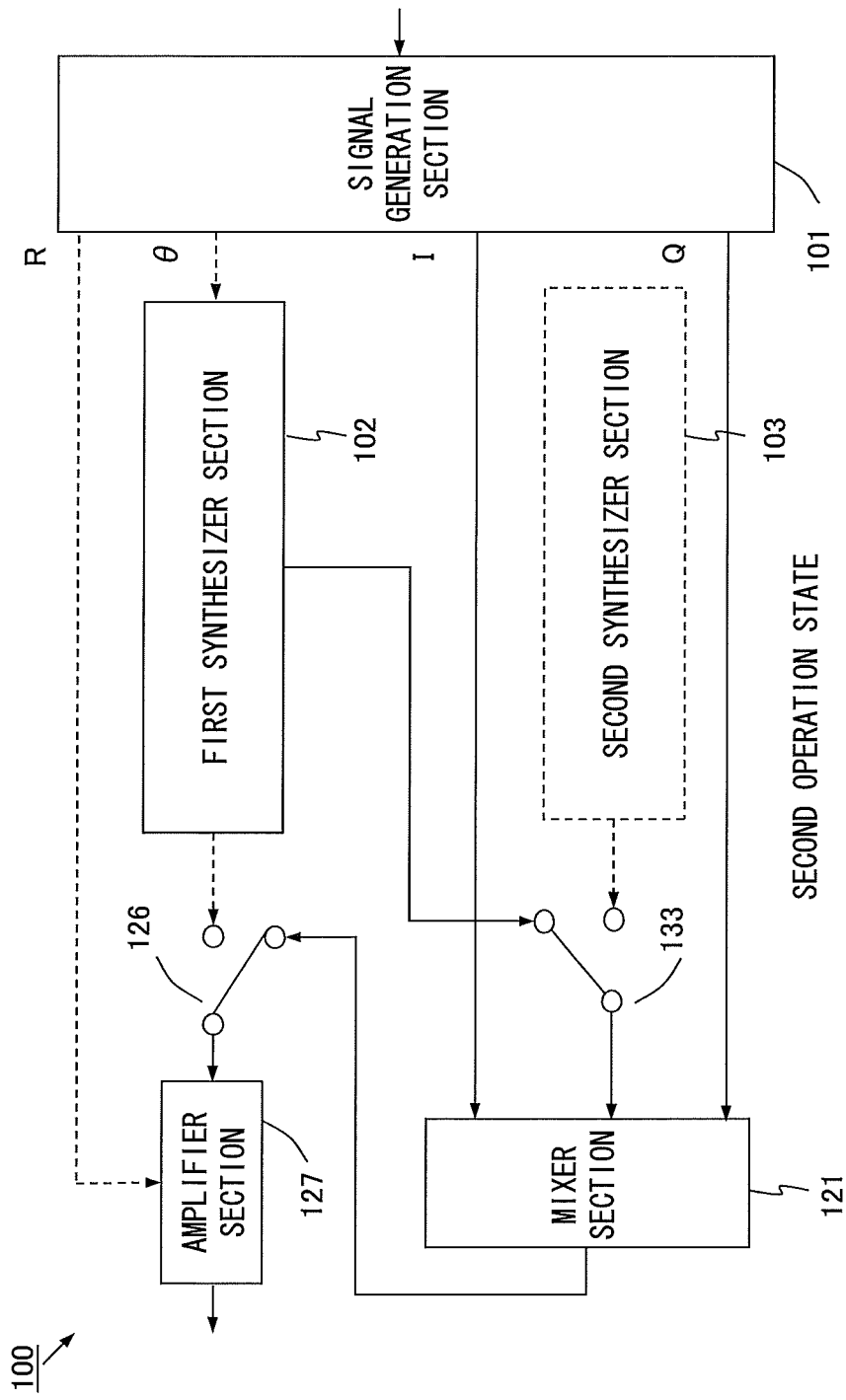
FIG. 3 illustrates a second operation state of the transmitter circuit according to the first embodiment of the present invention.

In the second operation state, the quadrature modulation is performed by using an output of the first synthesizer section 102. In this state, the signal generation section 101 outputs the I signal and the Q signal. As shown in FIG. 3, the switch 126 is in such a state as to enable the output of the mixer section 121 to be inputted to the amplifier section. Further, the switch 133 is in such a state as to enable the output of the first synthesizer section 102 to be inputted to the mixer section 121.

Figure 4:
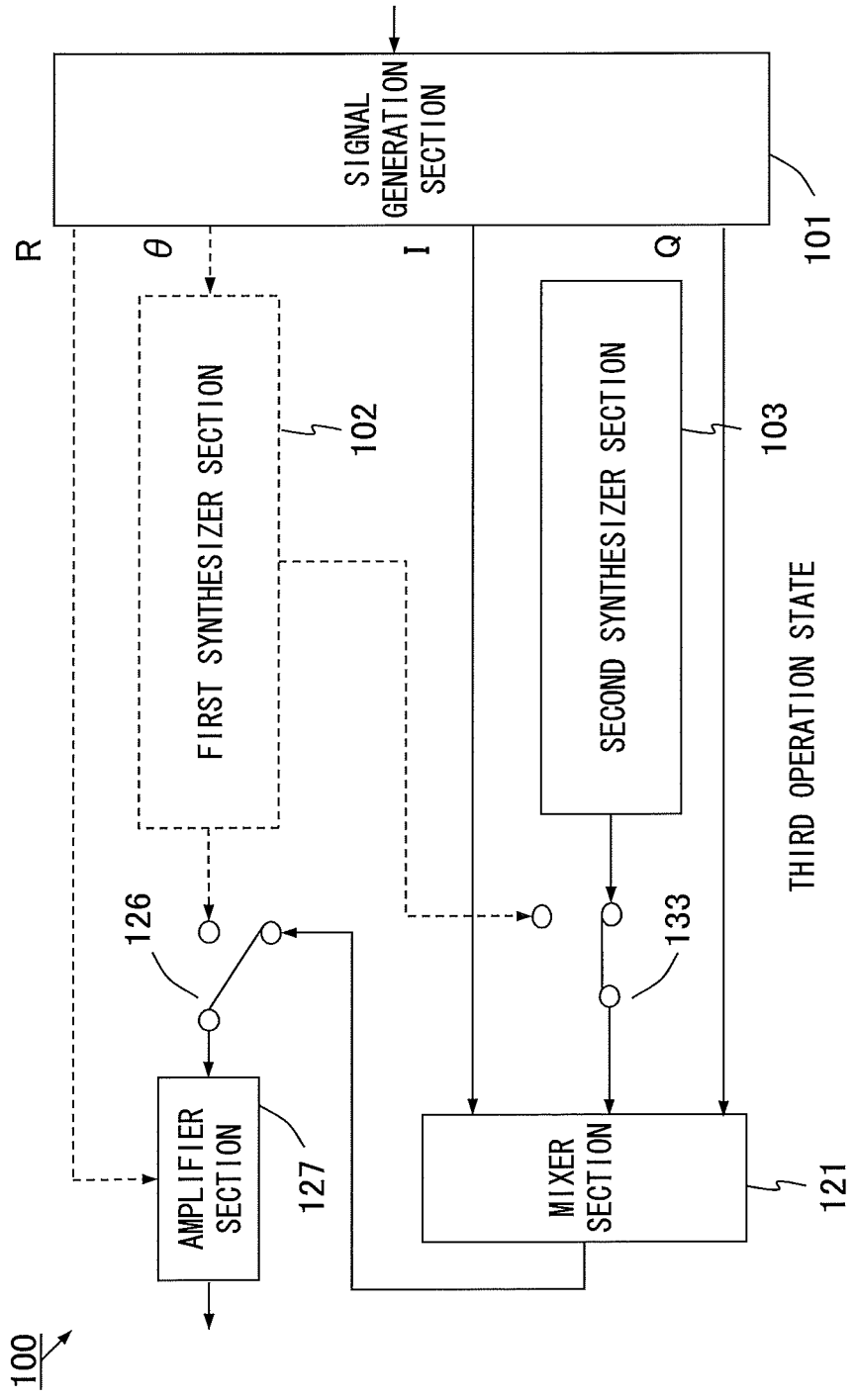
FIG. 4 illustrates a third operation state of the transmitter circuit according to the first embodiment of the present invention.

In the third operation state, the quadrature modulation is performed by using an output of the second synthesizer section 103. In this state, the signal generation section 101 outputs the I signal and the Q signal. As shown in FIG. 4, the switch 126 is in such a state as to enable the output of the mixer section 121 to be inputted to the amplifier section 127. Further, the switch 133 is in such a state as to enable the output of the second synthesizer section 103 to be inputted to the mixer section 121.

Controls of each module which are necessary for switching the operation state as described above, such as a control for switching of each of the switch 126 and the switch 133, a control for powering on or off each of the first synthesizer section 102 and the second synthesizer section 103, and a control for operation of the PA driver 134, are performed by the control section 160. In the present embodiment, as shown in FIG. 1, control lines are provided from the control section 160 to each of the switch 126, the switch 133, the first synthesizer section 102, the second synthesizer section 103, and the PA driver 134, and signals for the controls are transmitted. Although a case is described where the control section 160 is provided inside the signal generation section 101, this is merely an example. The control section 160 may be independently provided in the transmitter circuit 100, or may be provide inside another module.

When the polar modulation state is switched to the quadrature modulation state, the first operation state shifts through the second operation state to the third operation state. On the other hand, when the quadrature modulation state is switched to the polar modulation state, the third operation state shifts to the first operation state.

Figure 5:
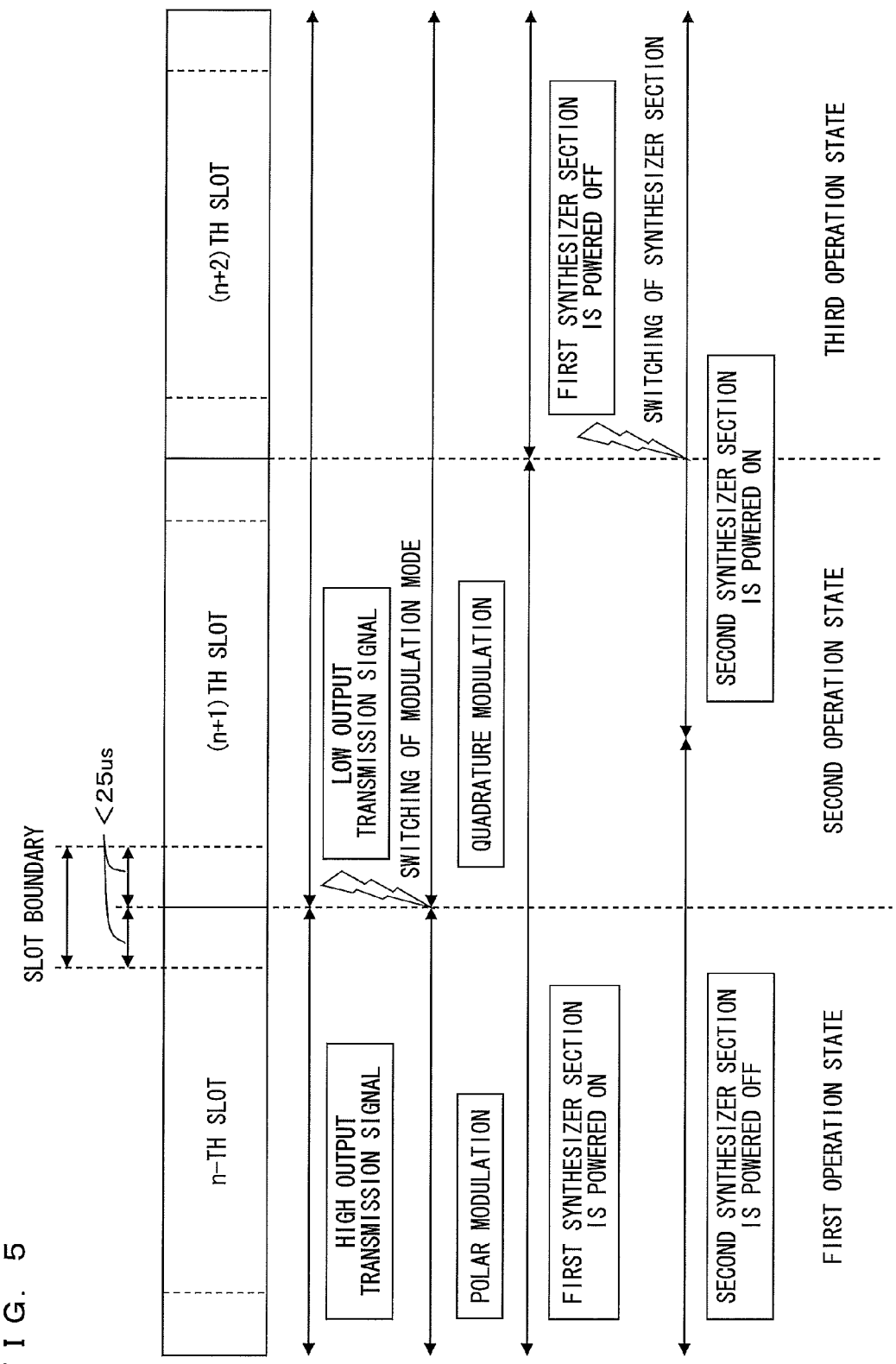
FIG. 5 illustrates a process of switching an operation state of the transmitter circuit according to the first embodiment of the present invention.
Figure 6:
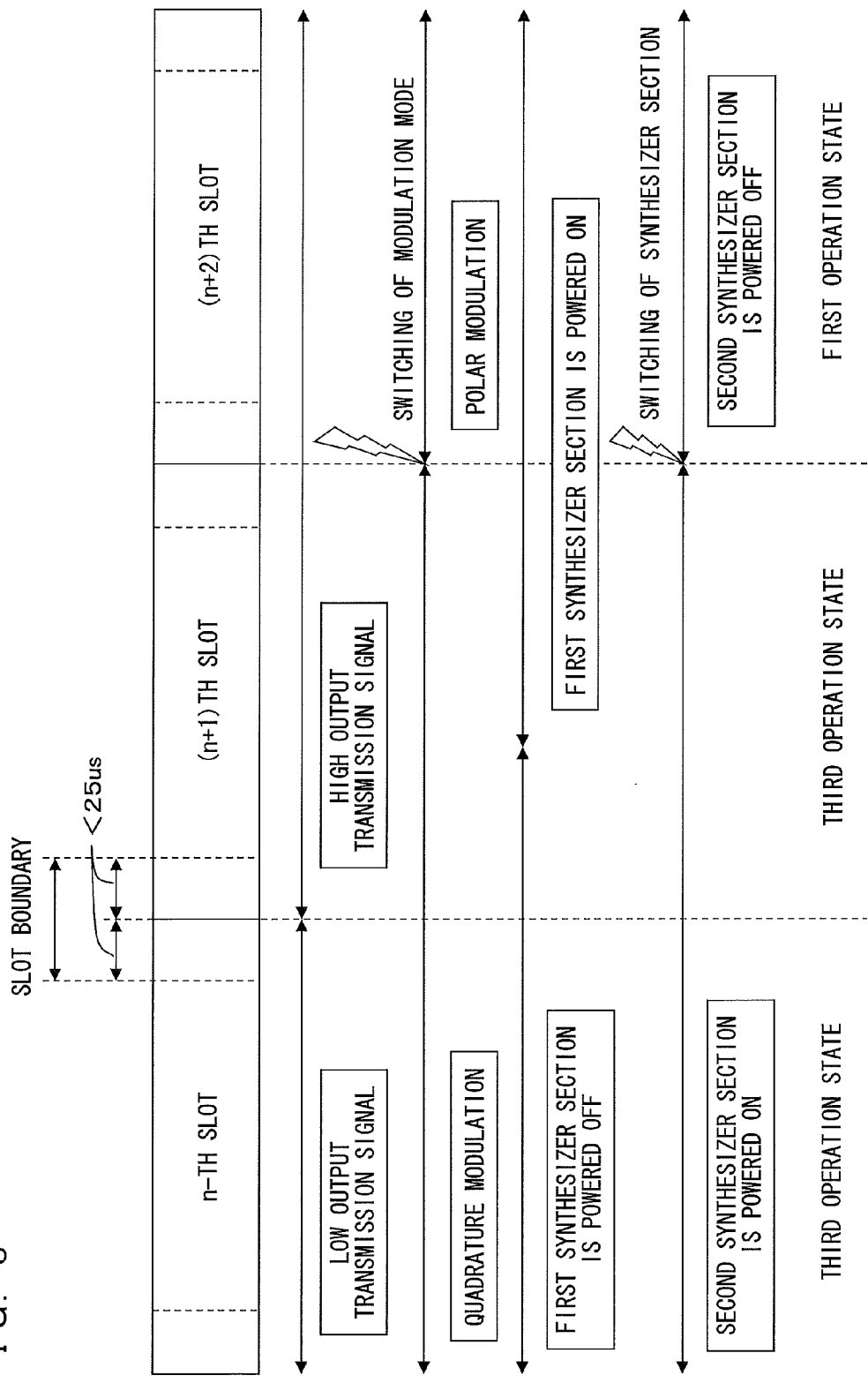
FIG. 6 illustrates a process of switching an operation state of the transmitter circuit according to the first embodiment of the present invention.

Hereinafter, the switching of the modulation mode will be described in detail with reference to FIG. 5 and FIG. 6. Firstly, a case where the polar modulation state shifts to the quadrature modulation state will be described with reference to FIG. 5. The transmission signal is divided into time units called slots, and transmitted. In FIG. 5, the n-th slot to the (n+2)th slot are shown. A given time width called a slot boundary is set between the slots, and, during this time, the transmission signal is not transmitted. In the n-th slot, the polar modulation is performed, and the transmitter circuit 100 operates in the first operation state. It is assumed that, in the n-th slot, the transmitter circuit 100 receives an instruction for reducing an output level of the transmission signal. The transmitter circuit 100 starts a process of switching to the quadrature modulation mode at a time of boundary between the n-th slot and the (n+1)th slot. Namely, at the time of boundary between the n-th slot and the (n+1)th slot, the switch 126 performs switching so as to shift the first operation state to the second operation state, so that modulation is performed in the quadrature modulation mode. In the (n+1)th slot, the transmitter circuit 100 operates in the second operation state. During the (n+1)th slot, power supply to the second synthesizer section 103 is started. At a time of boundary between the (n+1)th slot and the (n+2)th slot, which is the subsequent slot boundary, the switch 133 performs switching, and, in the (n+2)th slot, the transmitter circuit 100 operates in the third operation state. Further, power supply to the first synthesizer section 102 is stopped.

As described above, when the polar modulation state is switched to the quadrature modulation state, a time period from start of power supply to the second synthesizer section 103, up to actual use of the output of the second synthesizer section 103 for generating the transmission signal, is included in the (n+1)th slot. This is because, since a certain time period is necessary for stabilizing the oscillation characteristic of the second synthesizer section 103 in a desired status, the use of the second synthesizer section 103 is avoided during the certain time period. Namely, in the (n+1)th slot, operation is performed in the second operation state using the first synthesizer section 102. Since the time period necessary for stabilizing the oscillation characteristic of the second synthesizer section is shorter than one slot time, the second operation state continues during one slot time only. However, when the time period necessary for the stabilization is longer than one slot time, the second operation state may be continued for a time period longer than one slot time.

Next, a case where the quadrature modulation state shifts to the polar modulation state will be described with reference to FIG. 6. FIG. 6 shows the n-th slot to the (n+2)th slot, similarly to FIG. 5. In the n-th slot, the quadrature modulation is performed, and the transmitter circuit 100 operates in the third operation state. It is assumed that, in the n-th slot, the transmitter circuit 100 receives an instruction for enhancing the output level of the transmission signal. The transmitter circuit 100 starts a process of switching to the polar modulation mode at a time of boundary between the n-th slot and the (n+1)th slot. In the (n+1)th slot, switching of the modulation mode is not performed, and the output level of the transmission signal is enhanced by a gain of the amplifier section 127 being adjusted, in response to an instruction issued from a base station or the like for enhancing the output. Next, during the (n+1)th slot, power supply to the first synthesizer section 102 is started. At a time of boundary between the (n+1)th slot and the (n+2)th slot, each of the switches 126 and 133 performs switching, and, in the (n+2)th slot, the transmitter circuit 100 operates in the first operation state, and performs modulation in the polar modulation mode. Further, the power supply to the second synthesizer section 103 is stopped.

As described above, when the quadrature modulation state is switched to the polar modulation status, a time period from the start of power supply to the first synthesizer section 102, up to actual use of the output of the first synthesizer section 102 for generating the transmission signal, is included in the (n+1)th slot. This is because a certain time period is necessary for stabilizing the oscillation characteristic of the first synthesizer section 102 in a desired state, similarly to the second synthesizer section 103. In the (n+1)th slot, the third operation state is continued, and modulation is performed in the quadrature mode. Namely, in the (n+1)th slot, switching of the modulation mode is not performed. This is different from the case where the polar modulation mode is switched to the quadrature modulation mode. This is because, since only the first synthesizer section 102 can generate a phase component modulated signal for the polar modulation, the polar modulation cannot be performed while the first synthesizer section 102 cannot be used.

As described above, although operation and stopping of each of the first and the second synthesizer sections 102 and 103 are repeated according to the modulation mode being switched, the synthesizer sections are not used for generating the transmission signal while the oscillation frequency of each synthesizer is not stable, thereby preventing degradation in quality of the transmission signal. For example, in a case where a communication between a base station and a communication apparatus including the transmitter circuit 100 is made, when the communication status frequently changes so as to shift from a value greater than a threshold value between "a favorable communication status" and "an unfavorable communication status" to a value less than the threshold value, or vice versa, the base station may issue, to the communication apparatus, an instruction for enhancing or reducing a level of the transmission signal in every communication slot. An operation performed when an instruction for switching the modulation mode is frequency issued to the transmitter circuit 100 based on such an instruction from the base station, will be described below.

Figure 7:
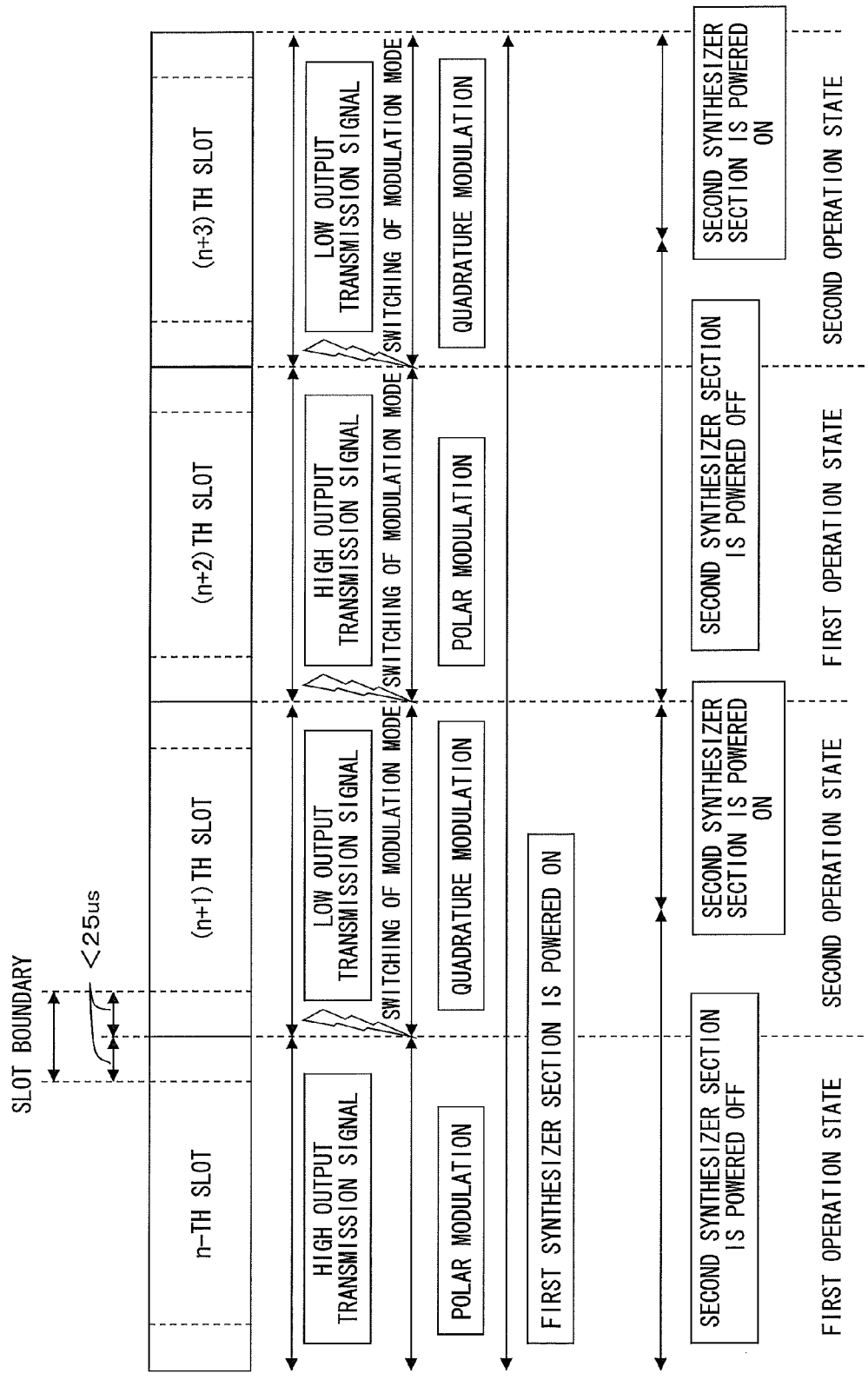
FIG. 7 illustrates a process of switching an operation state of the transmitter circuit according to the first embodiment of the present invention.

FIG. 7 illustrates an operation performed by the transmitter circuit 100 when the instruction for switching as described above is frequently issued during the first operation state. A case will be described where an instruction for switching to the quadrature modulation mode is issued in the n-th slot while the operation is being performed in the first operation state in the polar modulation mode. In this case, in the (n+1)th slot, switching to the quadrature modulation is performed, and an operation in the second operation state is performed. Further, if an instruction for switching to the polar modulation mode is issued in this slot, the transmitter circuit 100 returns to the first operation state in the (n+2)th slot, and shifts to the polar modulation mode. Namely, although the second synthesizer section 103 is powered on in the (n+1)th slot, the second synthesizer section 103 is powered off in the (n+2)th slot, and shifting to the third operation state is not performed. Further, if an instruction for switching to the quadrature modulation is further issued in this slot, the operation is switched to the quadrature modulation in the (n+3)th slot, and the operation is performed in the second operation state.

Figure 8:
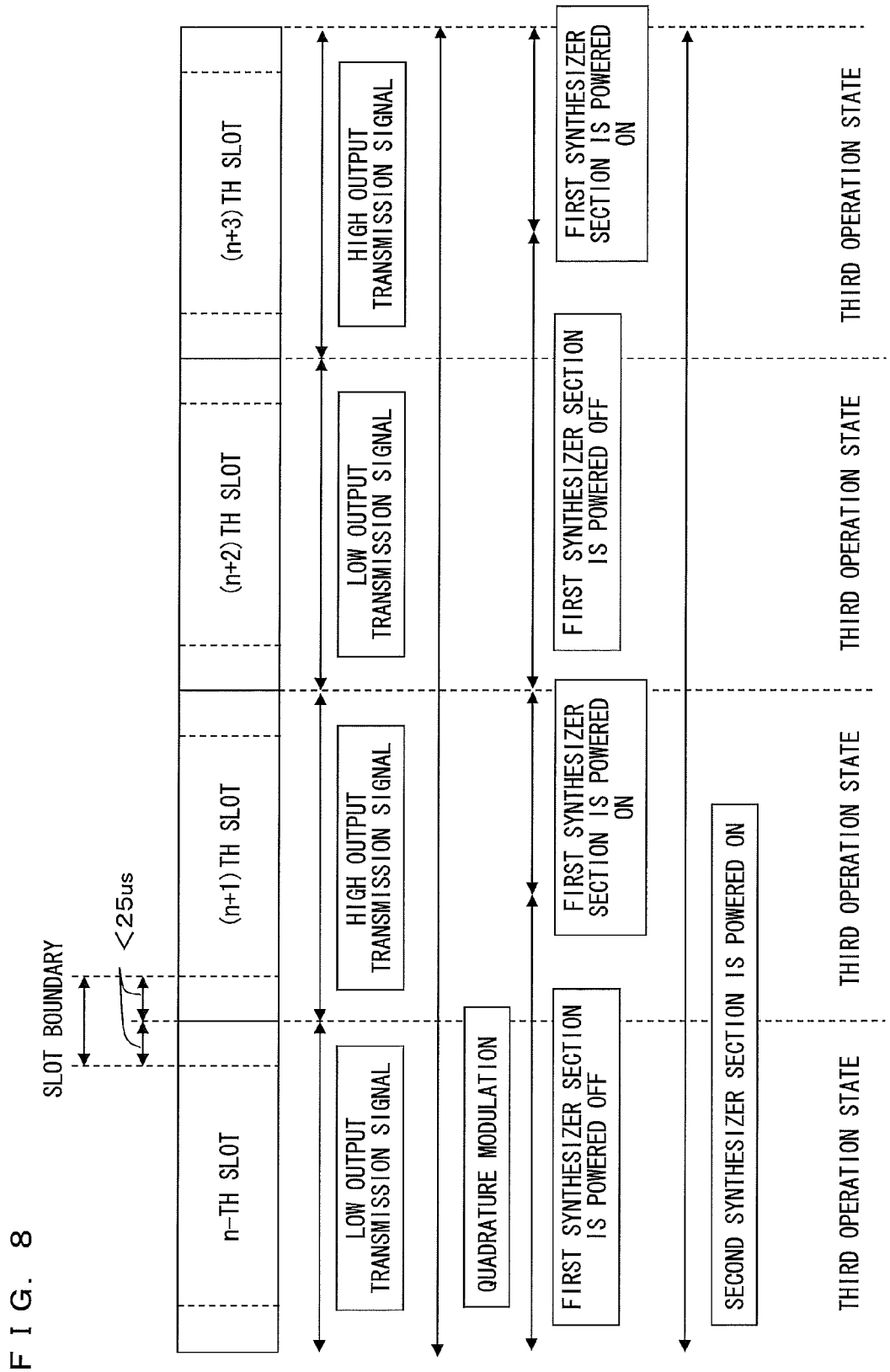
FIG. 8 illustrates a process of switching an operation state of the transmitter circuit according to the first embodiment of the present invention.

FIG. 8 illustrates an operation performed by the transmitter circuit 100 when the instruction for switching as described above is frequently issued in the third operation state. A case will be described where an instruction for switching to the polar modulation mode is issued in the n-th slot while the operation is being performed in the third operation state in the quadrature modulation mode. In this case, although the third operation state is maintained in the (n+1)th slot, an output level of the transmission signal is enhanced by a gain of the amplifier section 127 being adjusted, in response to an instruction issued from the base station or the like for enhancing the output. Further, the first synthesizer section 102 is powered on so as to shift to the first operation state. Further, if an instruction for switching to the quadrature modulation mode is further issued in this slot, the transmitter circuit 100 continues to operate in the third operation state in the (n+2)th slot. Namely, although the first synthesizer section 102 is powered on in the (n+1)th slot, the first synthesizer section 102 is powered off in the (n+2)th slot, and shifting to the first operation state is not performed. Further, if an instruction for switching to the polar modulation is further issued in this slot, although the third operation state is maintained in the (n+3)th slot, the output level of the transmission signal is enhanced by a gain of the amplifier section 127 being adjusted, in response to an instruction issued from the base station or the like for enhancing the output. The first synthesizer section 102 is powered on so as to shift to the first operation state.

As described above, also when an instruction for enhancing or reducing the level of the transmission signal is frequently issued from the base station or the like, the transmitter circuit 100 can respond to the instruction.

Further, the first synthesizer section 102 needs to have an oscillation accuracy higher than the second synthesizer section 103, in order to perform phase modulation based on the phase component signal in the polar modulation. In general, an error in oscillation frequency occurs in the VCO depending on a temperature. In the present embodiment, in order to calibrate the error in oscillation frequency caused due to temperature change, a mechanism for calibrating a temperature as described below is provided for the first VCO 111 of the first synthesizer section 102.

Figure 9:
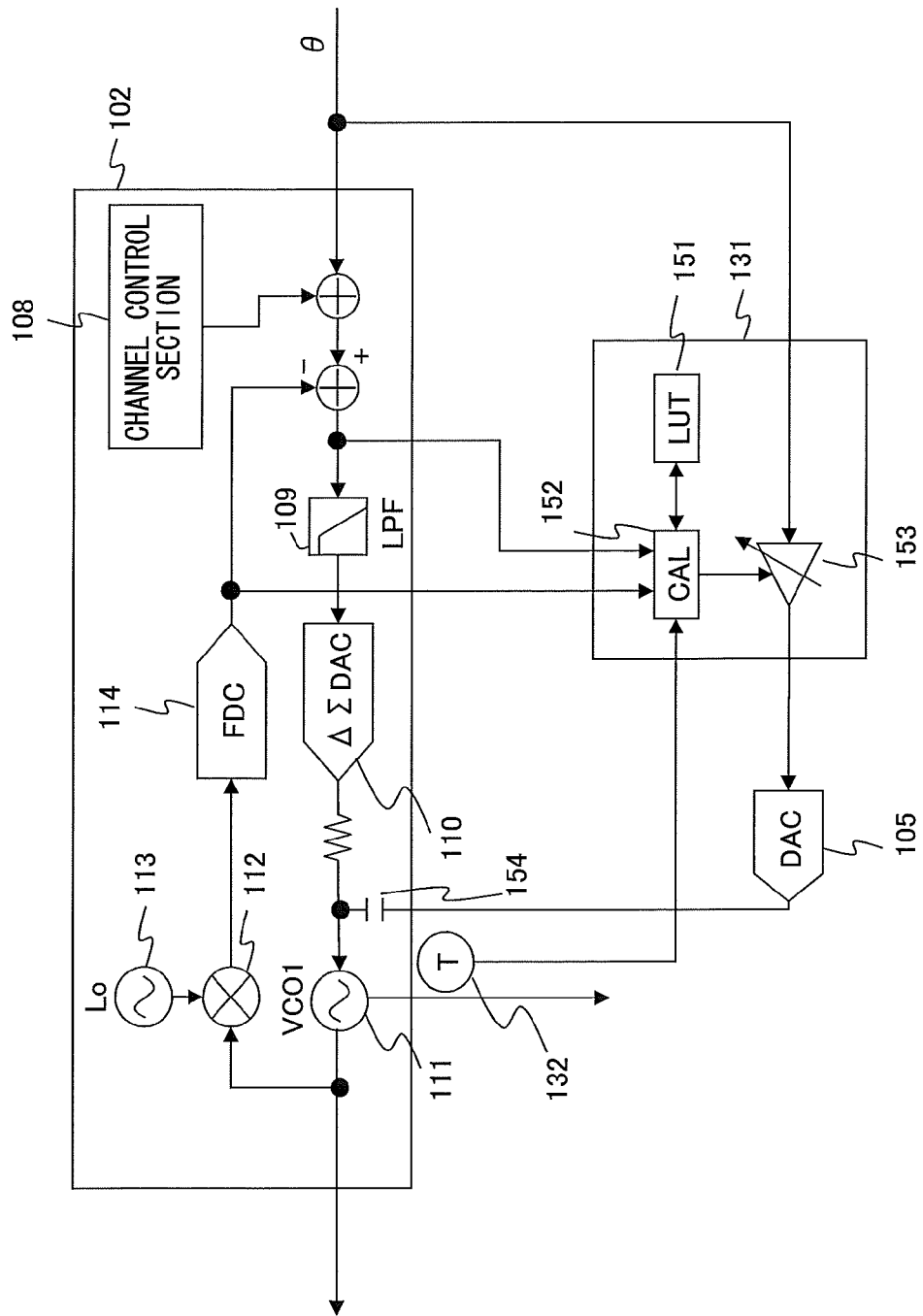
FIG. 9 illustrates a first synthesizer section and a temperature calibration section of the transmitter circuit according to the first embodiment of the present invention.

The calibration for variation in oscillation frequency which occurs due to temperature change will be described below with reference to FIG. 9 to FIG. 11. FIG. 9 illustrates the first synthesizer section 102, the first temperature calibration section 131, and the first temperature sensor 132 in the transmitter circuit 100. The first temperature calibration section 131 include a first calculator 152, a LUT (look-up table) 151, and a variable gain amplifier 153. The first temperature sensor 132 is located close to the first VCO 111 of the first synthesizer section 102. The first calculator 152 can obtain, as an input, error information representing an error of oscillation frequency in the first VCO 111 of the first synthesizer section 102, an output of the FDC 114 of the first synthesizer section 102, and an output of the first temperature sensor 132. Further, the first calculator 152 can refer to the LUT 151 in which values used for gain correction are stored. Further, an output of the first calculator 152 is used for setting a gain in the variable gain amplifier 153. The variable gain amplifier 153 amplifies the phase component signal according to a gain based on an input from the first calculator 152, and outputs the amplified phase component signal as an output of the first temperature calibration section 131. The output is inputted to the first VCO 111 via the DAC 105 and a capacitor 154. Thus, a voltage supplied to the first VCO 111 is varied and an oscillation frequency of the first VCO 111 is also varied.

Figure 10:
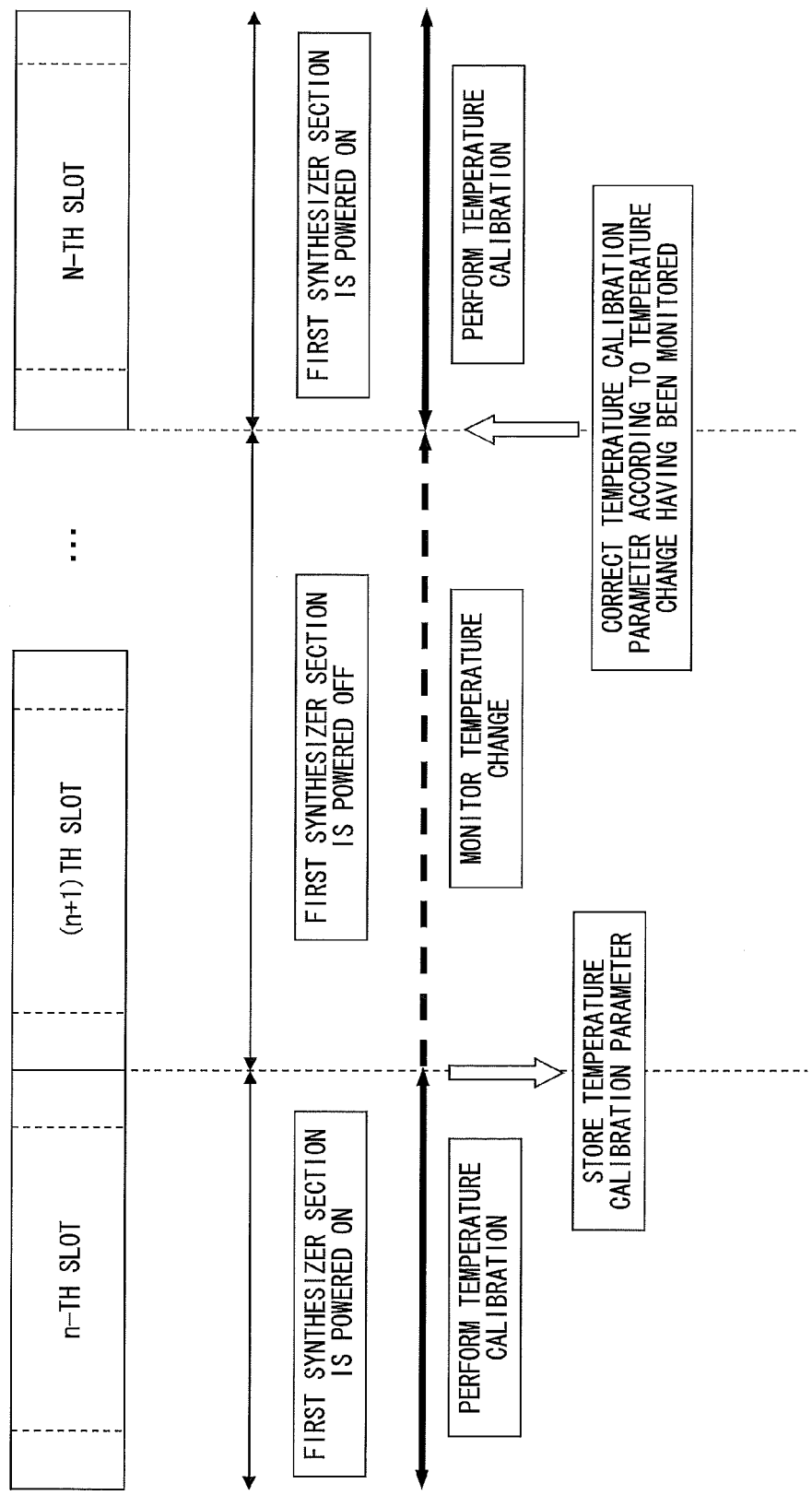
FIG. 10 illustrates a temperature calibration process performed by the transmitter circuit according to the first embodiment of the present invention.

FIG. 10 illustrates a temperature calibration process for the first VCO 111. As shown in FIG. 10, while the first synthesizer section 102 is operating and the first VCO 111 is oscillating, the temperature calibration is constantly performed. At this time, the first calculator 152 shown in FIG. 9 corrects a gain of the variable gain amplifier 153, based on the error information on the oscillation frequency of the first VCO 111, such that the oscillation frequency of the first VCO 111 becomes equal to a predetermined frequency. The output of the FDC 114 is not used for the gain correction process. The use of the output of the FDC 114 will be described below. As a result of the gain correction for the variable gain amplifier 153, a voltage via the capacitor 154 varies in the first VCO 111, and the oscillation frequency of the first VCO 111 is varied in a direction in which the oscillation frequency of the first VCO 111 approaches the predetermined frequency. By this process being repeated, the first VCO 111 can constantly maintain a predetermined oscillation frequency. Further, when the first synthesizer section 102 shifts from a state in which the first synthesizer section 102 is operating to a state where it does not operate, to stop the operation of the first VCO 111, the first calculator 152 stores the value of corrected gain for the variable gain amplifier 153 as the temperature calibration parameter having been obtained immediately before the stop of the operation, as shown in FIG. 10.

In the LUT 151, a table for gain correction values is previously stored. The table for the gain correction values is set when, for example, delivery from a factory is made. FIG. 11 illustrates an example of such a table. In this example, for each of N kinds of oscillation frequencies of the first VCO 111, that is, for each of Freq1, Freq2, . . . , FreqN (Hz), gain correction values to be set in the variable gain amplifier 153 when a temperature increases by one degree or a temperature decreases by one degree, are stored, in the table, for both a range of temperatures higher than a reference temperature $T_{mid}$ (° C.), and a range of temperatures lower than the reference temperature $T_{mid}$ (° C.).

As shown in FIG. 10, when a state in which the first synthesizer section 102 does not operate shifts to a state in which the first synthesizer section 102 operates, and the first VCO 111 starts to operate, the first calculator 152 calculates a new temperature calibration parameter, based on not only the temperature calibration parameter which has been obtained and stored immediately before the stop, but also the gain correction value stored in the table. While the first VCO 111 is stopped, a temperature of the first VCO 111 varies. Therefore, it is not appropriate to reuse, as it is, the temperature calibration parameter having been stored, and it is necessary to further perform gain correction according to an amount of temperature change in the first VCO 111.

The temperature change of the first VCO 111 is measured by the first temperature sensor 132. The first calculator 152 reads, from the table shown in FIG. 11, a gain correction value which corresponds to an amount of the temperature change having been measured, and an oscillation frequency to be obtained in the first VCO 111, to calculate a new temperature calibration parameter. For example, in a case where the first temperature sensor 132 detects that the temperature of the first VCO 111 is changed by $\Delta T°$ C. in a range of temperatures higher than $T_{mid}°$ C. when a state in which the first synthesizer section 102 does not operate shifts to a state in which the first synthesizer section 102 operates, and the oscillation frequency is Freq1 Hz, the first calculator 152 obtains a value of Comp_PVal1×$\Delta T$. The first calculator 152 adds this value to the temperature calibration parameter having been obtained and stored immediately before the stop, to calculate a new temperature calibration parameter. Further, the first calculator 152 corrects a value of the gain of the variable gain amplifier 153 based on the new temperature calibration parameter. When the temperature of the first VCO 111 changes in a range of temperatures higher than $T_{mid}°$ C., Comp_PVal1 is used for the temperature calibration parameter as described above, and when the temperature of the first VCO 111 changes in a range of temperatures lower than $T_{mid}°$ C., Comp_NVal1 is used for the temperature calibration parameter. Further, when the temperature of the first VCO 111 changes from a value lower than $T_{mid}°$ C. to a value higher than $T_{mid}°$ C. or vice versa, Comp_PVal1 is used for a component of a temperature higher than $T_{mid}°$ C., which is obtained after temperature change, and Comp_NVal1 is used for a component of a temperature lower than $T_{mid}°$ C., which is obtained after temperature change.

Further, when a new frequency, for example, a frequency between Freq1 and Freq2, is to be obtained by oscillation, linear interpolation between gain correction values for Freq1 and Freq2 may be performed.

As described above, even in a case where the first VCO 111 stops operating and the temperature of the first VCO 111 is reduced when the operation is restarted, correction is made for the temperature reduction relative to the temperature calibration parameter having been obtained immediately before the stop, so that the oscillation frequency of the first VCO 111 can be stabilized fast so as to become a predetermined frequency, thereby preventing degradation in quality of the transmission signal.

When the temperature calibration parameter is not stored, the first calculator 152 cannot perform such a temperature calibration. In order to prevent this, the transmitter circuit 100 may be operated in the polar modulation mode regardless of output power when the operation is started, and perform temperature calibration before the first modulated signal is actually transmitted, so as to obtain a temperature calibration parameter.

Next, an exemplary method for setting table values to be stored in the LUT 151, will be described. Each value in the table is obtained by oscillation frequencies of the first VCO 111 being actually measured at different temperatures, when the transmitter circuit 100 is delivered from a factory. The variability characteristic of the oscillation frequency in the first VCO 111 is greatly different depending on individual devices. Therefore, the measurement is performed for each transmitter circuit 100, to individually set setting values.

Figure 12:
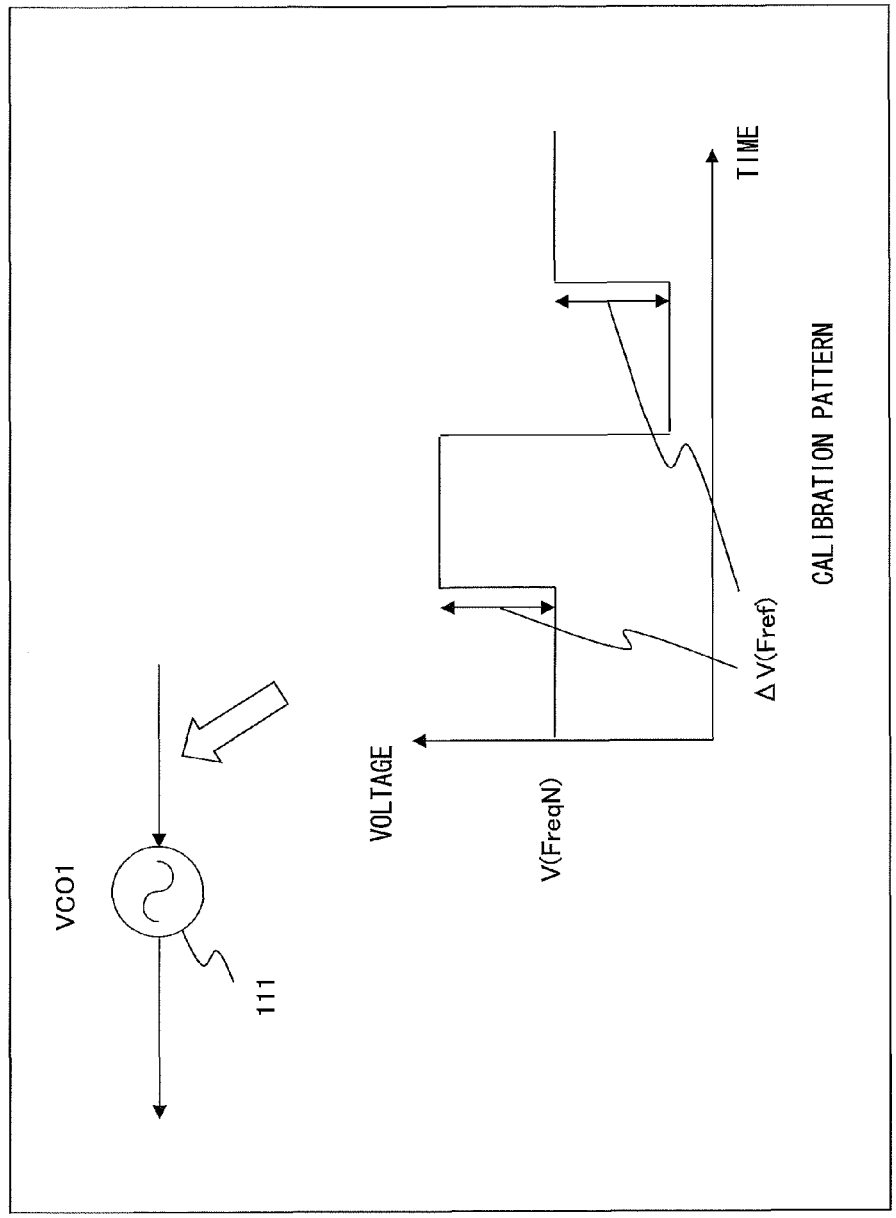
FIG. 12 illustrates an exemplary calibration pattern according to the first embodiment of the present invention.

This measurement is performed by a predetermined calibration pattern being inputted to the first VCO 111 for each of predetermined frequencies and each temperature. In the present embodiment, N kinds of frequencies, i.e, Freq1, Freq2, . . . , FreqN (Hz), are used, and three kinds of temperatures, i.e., $T_{high}$, $T_{mid}$, and $T_{low}$(° C.), are used. FIG. 12 illustrates an exemplary calibration pattern to be inputted to the first VCO 111. As shown in FIG. 12, the calibration pattern of each of the predetermined frequencies is a pattern in which a frequency higher than each of the predetermined frequencies, and a frequency lower than each of the predetermined frequencies are expected to be obtained in the first VCO 111 at regular intervals. V(FreqN) shown in FIG. 12 represents an input voltage at which a frequency obtained in the first VCO 111 is FreqN, and $\Delta V$ (Fref) represents a value of difference between voltages in the first VCO 111, and, when $\Delta V$ (Fref) is obtained, a difference between frequencies obtained in the first CO 111 is Fref. Therefore, when V(FreqN)+$\Delta V$(Fref) is inputted to the first VCO 111, the first VCO 111 is expected to output a frequency of FreqN+Fref.

The first calculator 152 obtains an output of the FDC 114 in a state where a feedback loop including the local oscillator 113, the mixer 112, and the FDC 114, which are shown in FIG. 9, is open, and temperature characteristic of the oscillation frequency of the first VCO 111 is likely to be observed, and the first calculator 152 measures, for each temperature, the oscillation frequency of the first VCO 111 based on the calibration pattern of each frequency. Based on a result of such a measurement, the first calculator 152 calculates, for each frequency and each temperature, such a gain correction value as to cancel an error in frequency. For example, when the measured frequency of the first VCO 111 at V(FreqN)+$\Delta V$(Fref) is FreqN+Fmes1, and the measured frequency of the first VCO 111 at V(FreqN)−$\Delta V$(Fref) is FreqN−Fmes2, the gain correction value is obtained as (Fref/Fmes1+Fref/Fmes2)/2. The calibration pattern described above is an example, and a pattern other than that described above may be used.

Next, the first calculator 152 calculates a gain correction amount per temperature of 1° C. based on the gain correction value having been calculated. For example, in the case of the frequency Freq1 shown in FIG. 11, each of Comp_PVal1 and Comp_NVal1 is calculated as follows. Comp_PVal1=(the gain correction value at temperature $T_{high}$—the gain correction value at temperature $T_{mid}$)/($T_{high}$-$T_{mid}$) is satisfied, and Comp_NVal1=(the gain correction value at temperature $T_{mid}$—the gain correction value at temperature $T_{low}$)/($T_{mid}$−

$T_{low}$) is satisfied. In this example, the gain correction value is obtained by linear interpolation being performed for an amount of temperature change lower than 1° C., in each of a region of temperatures higher than $T_{mid}$, and a region of temperatures lower than $T_{mid}$. However, the measurement may be performed at the increased number of temperatures, thereby enhancing accuracy.

As described above, according to the present embodiment, in the quadrature modulation in which a level of an output signal is low, the switching between the VCOs can be performed without degrading a quality of the transmission signal, thereby enabling enhancement of power efficiency of the transmitter circuit.

Second Embodiment

Figure 13:
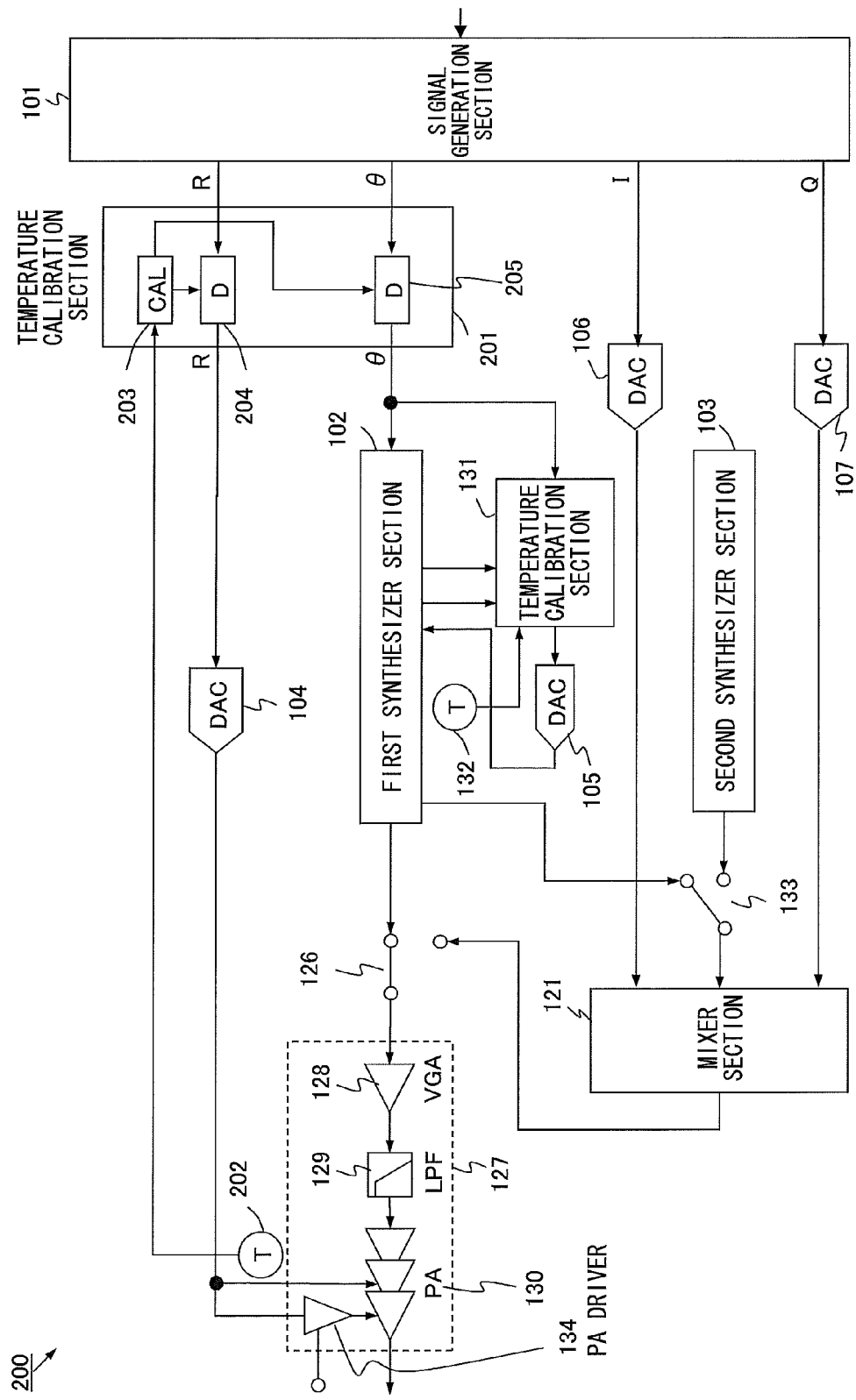
FIG. 13 illustrates a transmitter circuit according to a second embodiment of the present invention.

A second embodiment of the present invention will be described below. A configuration of a transmitter circuit 200 according to the present embodiment will be described with reference to FIG. 13. FIG. 13 illustrates an outline of the configuration of the transmitter circuit 200. The transmitter circuit 200 includes a second temperature calibration section 201 and a second temperature sensor 202, in addition to the components of the transmitter circuit 100 according to the first embodiment. The second temperature calibration section 201 includes a second calculator 203, and delay units 204 and 205. The other components are the same as those of the transmitter circuit 100 according to the first embodiment, and are denoted by the same corresponding reference numerals, and the description thereof is not given. In FIG. 13, the internal structures of the first synthesizer section 102, the second synthesizer section 103, and the mixer section 121 are not shown, and illustration is simplified as compared to in FIG. 1. Further, the control section 160 of the signal generation section 101, and the control lines from the control section 160 to each of the switch 126, the switch 133, the first synthesizer section 102, the second synthesizer section 103, and the PA driver 134, are not shown.

In the first embodiment, a method is described which enables the temperature calibration for the first VCO 111 to be stably performed also when switching between the polar modulation and the quadrature modulation is performed. In the second embodiment, another example is described in which temperature calibration for delay adjustment between the amplitude component signal and the phase component signal is performed.

The amplitude component signal and the phase component signal outputted from the signal generation section are inputted to the delay units 204 and 205, respectively, in the second temperature calibration section 201. As described below, delay adjustment between the amplitude component signal and the phase component signal is performed according to a delay calibration amount calculated by the second calculator 203, and the amplitude component signal and the phase component signal are outputted from the second temperature calibration section 201. The amplitude component signal having been subjected to the delay adjustment is inputted via the DAC 104 to the amplifier section 127, whereas the phase component signal having been subjected to the delay adjustment is inputted to the first synthesizer section 102. Further, the second temperature sensor 202 is located close to the power amplifier 130 in the amplifier section 127, and detects a temperature of the power amplifier 130. The second calculator 203 is connected to the second temperature sensor 202, and is able to monitor a temperature of the power amplifier 130.

In the transmitter circuit performing the polar modulation, the amplitude component signal and the phase component signal are generated from an input signal, and are modulated into an amplitude-modulated signal and a phase-modulated signal in different paths, respectively. Thereafter, the amplitude-modulated signal and the phase-modulated signal are amplified by an amplifying section. Therefore, a modulation distortion is likely to be caused due to signal delay which is a time lag between the amplitude signal and the phase signal. Each component used for the polar modulation mode has its signal delay characteristic varied according to temperature change. Therefore, a signal delay between the amplitude signal and the phase signal may be increased due to the temperature change.

In the present embodiment, the second temperature calibration section calibrates the signal delay caused due to the temperature change in the power amplifier 130. The second calculator 203 in the second temperature calibration section 201 monitors a temperature (° C.) of the power amplifier 130, which is measured by the second temperature sensor 202, and calculates a delay calibration amount (ns) for delay between the amplitude signal and the phase signal. As a calculation method, a predetermined formula which is a function for temperature is used. Instead of using the formula, the second calculator 203 may have a look-up table, and perform interpolation calculation based on calibration amounts for some temperatures, which are previously stored in the look-up table. The second calculator 203 controls the delay units 204 and 205 to delay an output time of one of the amplitude component signal and the phase component signal relative to the other thereof, based on the calculated calibration amount.

Thus, in the present embodiment, a signal delay caused due to the temperature change in the power amplifier 130 is calibrated, so that time lag of amplification and combination of the amplitude component signal and the phase component signal which are inputted to the power amplifier 130 is cancelled. Thus, prevention of degradation in quality of the transmission signal can be improved as compared to in the first embodiment.

Further, in the present embodiment, the second temperature calibration section 201 performs delay calibration for signal delay characteristic of the power amplifier 130. Further, a signal delay caused in another component can be calibrated when a position of the second temperature sensor 202 is changed so as to be located close to the other component, and a formula or a look-up table for delay calibration amounts is modified so as to meet the temperature characteristic of the other component. Further, temperatures of a plurality of components which are aligned and connected in series in a path in which the amplitude-modulated signal is generated, or in a path in which the phase-modulated signal is generated, may be monitored by temperature sensors located close to the plurality of components, and further a formula or a look-up table for delay calibration amounts may be provided for each of the components. Thus, based on the temperature of each component, the delay calibration amount of each component can be calculated. By adding the delay calibration amounts of each component, a delay calibration amount for the entire path in which the transmission signal is generated from the amplitude component signal and the phase component signal can be obtained. Therefore, the delay calibration is performed based on the delay calibration amount, thereby improving prevention of degradation in quality of the transmission signal.

Further, similarly to the first embodiment, in a case where the formula or the look-up table is used, the temperature calibration function of the second temperature calibration section 201 may be stopped in light of reduction of power consumption when the polar modulation mode is switched to the quadrature modulation mode, and the temperature calibration by the second temperature calibration section 201 may be restarted when the quadrature modulation mode is switched to the polar modulation mode, thereby enabling stable temperature calibration.

Third Embodiment

Figure 14:
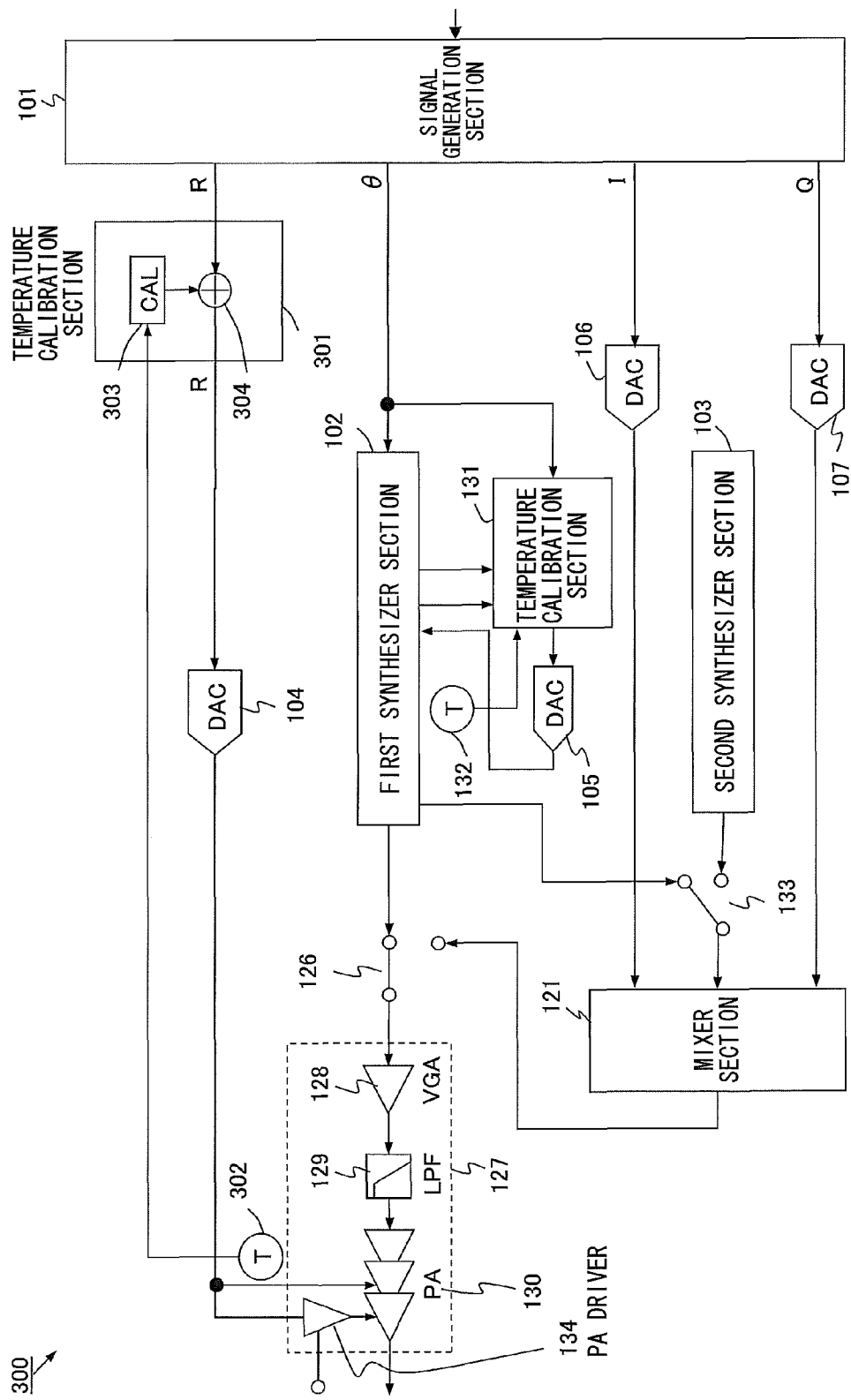
FIG. 14 illustrates a transmitter circuit according to a third embodiment of the present invention.

A third embodiment of the present invention will be described below. A configuration of a transmitter circuit 300 according to the present embodiment will be described with reference to FIG. 14. FIG. 14 illustrates an outline of the configuration of the transmitter circuit 300. The transmitter circuit 300 includes a third temperature calibration section 301 and a third temperature sensor 302, in addition to the components of the transmitter circuit 100 of the first embodiment. The third temperature calibration section 301 includes a third calculator 303 and an adder 304. The other components are the same as those of the transmitter circuit 100 of the first embodiment, and are denoted by the same corresponding reference numerals, and the description thereof is not given. In FIG. 14, the internal structures of the first synthesizer section 102, the second synthesizer section 103, and the mixer section 121 are not shown, and the illustration is simplified as compared to in FIG. 1. Further, the control section 160 of the signal generation section 101, and the control lines from the control section 160 to each of the switch 126, the switch 133, the first synthesizer section 102, the second synthesizer section 103, and the PA driver 134, are not shown.

In the first embodiment, a method is described in which the temperature calibration for the first VCO 111 can be stably performed also when switching between the polar modulation and the quadrature modulation is performed. In the third embodiment, another example is described in which temperature calibration for an offset of a collector voltage of the power amplifier 130 is performed.

The phase-modulated signal outputted from the first synthesizer section 102 is inputted to the power amplifier 130. When the power amplifier 130 amplifies and combines the phase-modulated signal with the amplitude-modulated signal, the amplitude-modulated signal is inputted as a collector voltage Vc to the power amplifier 130.

Figure 15:
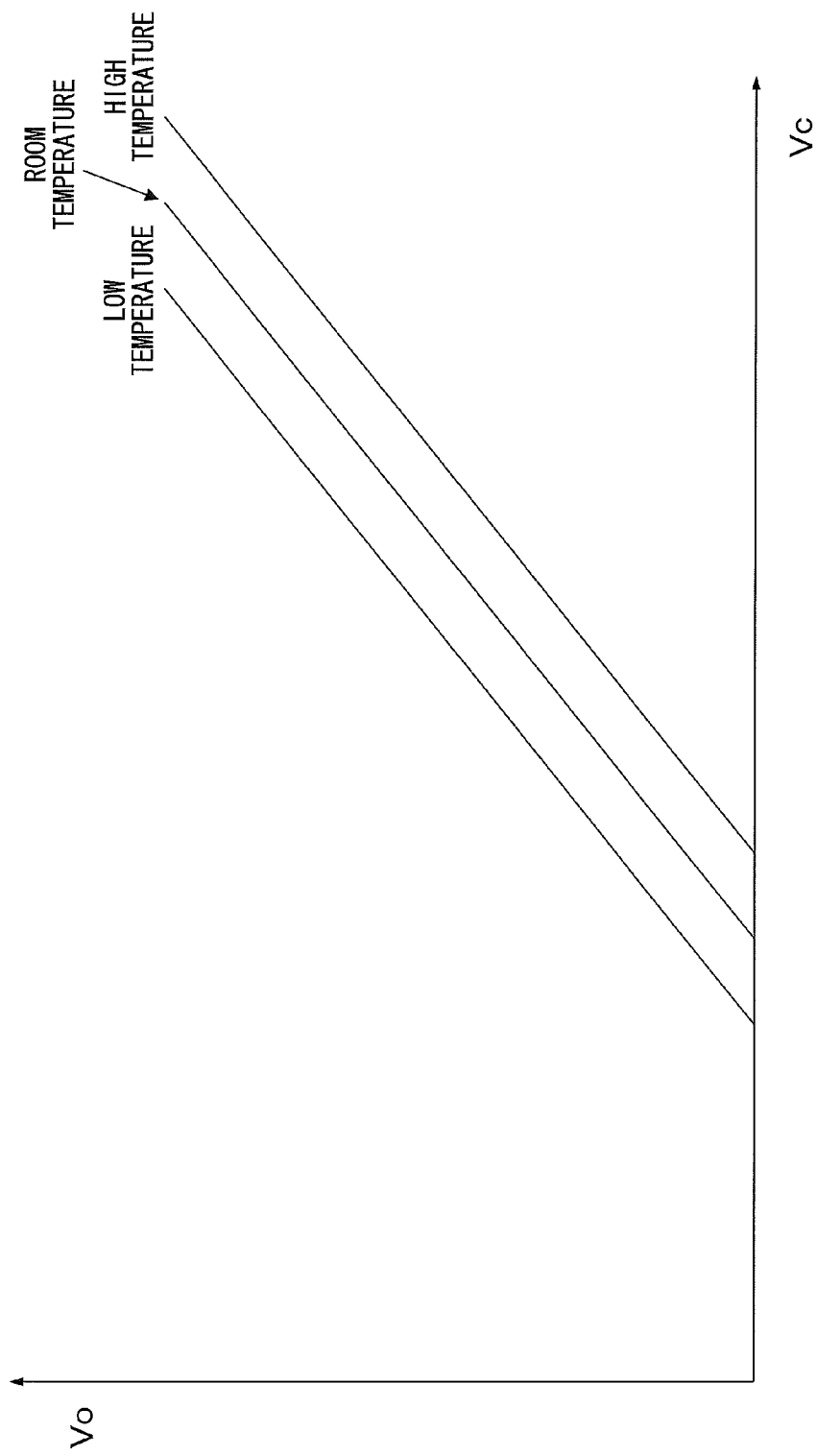
FIG. 15 illustrates an offset characteristic of a power amplifier.

The characteristic of the power amplifier 130 will be described with reference to FIG. 15. FIG. 15 illustrates a relationship between the collector voltage Vc supplied to the power amplifier 130 and an output voltage Vo. It is assumed that the magnitude of an input voltage (phase-modulated signal) is constant. As shown in FIG. 15, in the power amplifier 130, in a region in which the collector voltage Vc is low, the output voltage Vo cannot be obtained, so that a desired modulated signal cannot be outputted. Hereinafter, this characteristic of the power amplifier 130 is referred to as an offset characteristic, and a minimum collector voltage Vc by which the output voltage Vo can be obtained is referred to as an offset voltage. The offset voltage varies according to a temperature of the power amplifier 130. In a range in which the amplitude-modulated signal inputted to the power amplifier 130 indicates a value that is less than or equal to a value of the offset voltage, the phase-modulated signal cannot be amplified and combined with the amplitude-modulated signal, and distortion occurs in the transmission signal, thereby causing degradation in quality of the transmission signal.

In the present embodiment, the third temperature calibration section 301 calibrates the offset voltage according to the temperature of the power amplifier 130. The third calculator 303 of the third temperature calibration section 301 monitors a temperature (° C.) of the power amplifier 130, which is measured by the third temperature sensor 302, and calculates an offset calibration amount (V). As a calculation method, a predetermined formula which is a function for temperature is used. Instead of using the formula, the third calculator 303 may have a look-up table, and perform interpolation calculation based on calibration amounts for some temperatures, which are previously stored in the look-up table. The third calculator 303 calibrates a voltage of the amplitude component signal by means of the adder 304 according to the offset calibration amount having been calculated.

Figure 16:
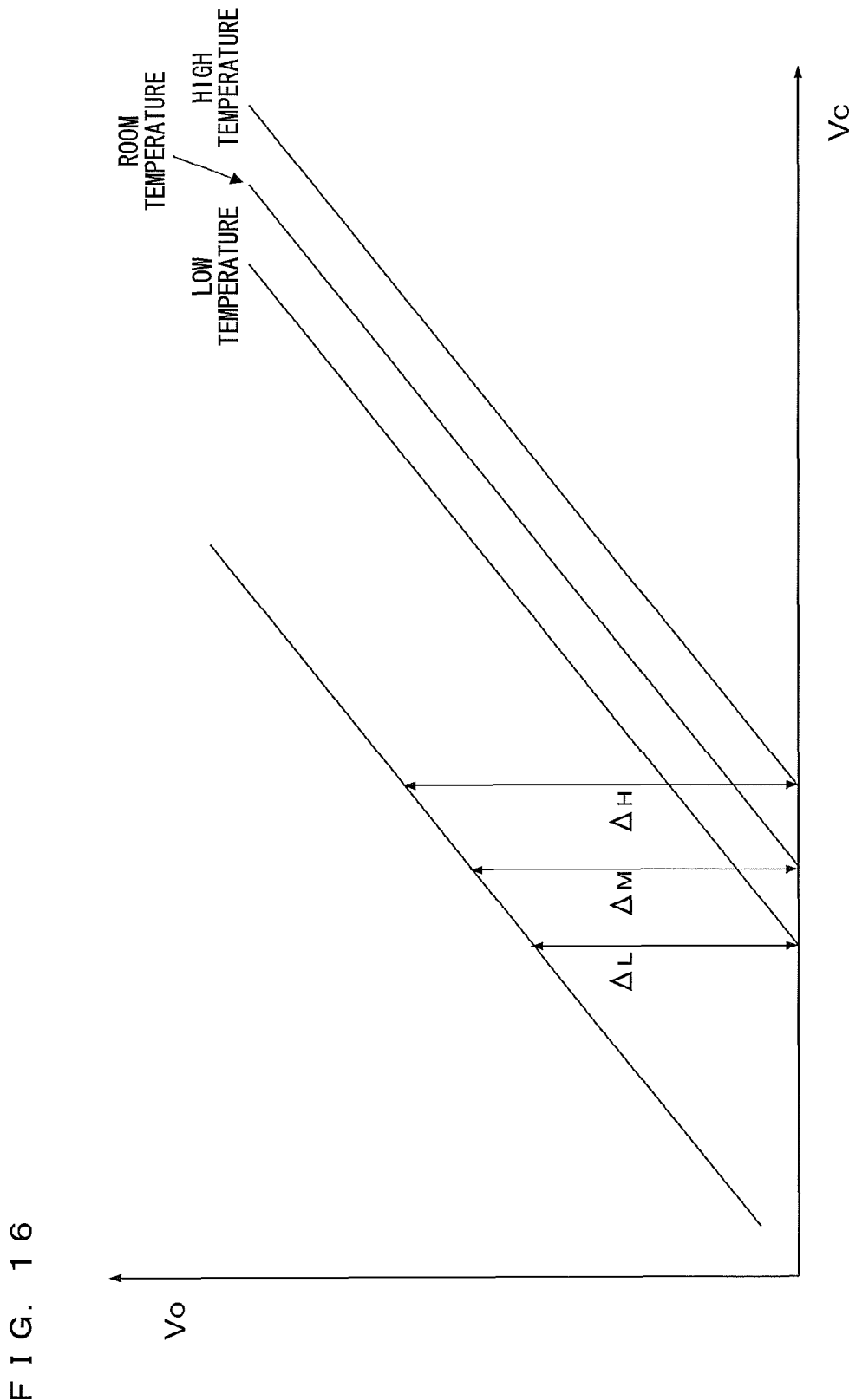
FIG. 16 illustrates an offset calibration amount of a power amplifier of the transmitter circuit according to the third embodiment of the present invention.

FIG. 16 illustrates an offset calibration amount based on the temperature of the power amplifier 130. When the temperature of the power amplifier 130 is low, room temperature, or high, the offset calibration amount is represented as $\Delta_L$, $\Delta_M$, or $\Delta_H$, respectively. It is understood that, after the offset calibration is performed, also in a range in which the collector voltage Vc is low, the output voltage Vo can be obtained.

As described above, in the present embodiment, the offset characteristic is calibrated according to the temperature of the power amplifier 130. Thus, a transmission signal having no distortion can be generated, and prevention of degradation in quality of the transmission signal can be improved as compared to in the first embodiment.

As described above, in the first to the third embodiments of the present invention, the transmitter circuit that switches between the quadrature modulation mode and the polar modulation mode can be realized without degrading a quality of the transmission signal, and power efficiency can be enhanced. The delay calibration of the second embodiment and the offset calibration of the third embodiment can be simultaneously implemented.

Further, similarly to the first embodiment, in a case where the formula or the look-up table is used, the temperature calibration function of the third temperature calibration section 301 may be stopped in light of reduction of power consumption when the polar modulation mode is switched to the quadrature modulation mode, and the temperature calibration by the third temperature calibration section 301 may be restarted when the quadrature modulation mode is switched to the polar modulation mode, thereby enabling stable temperature calibration.

Fourth Embodiment

Figure 17:
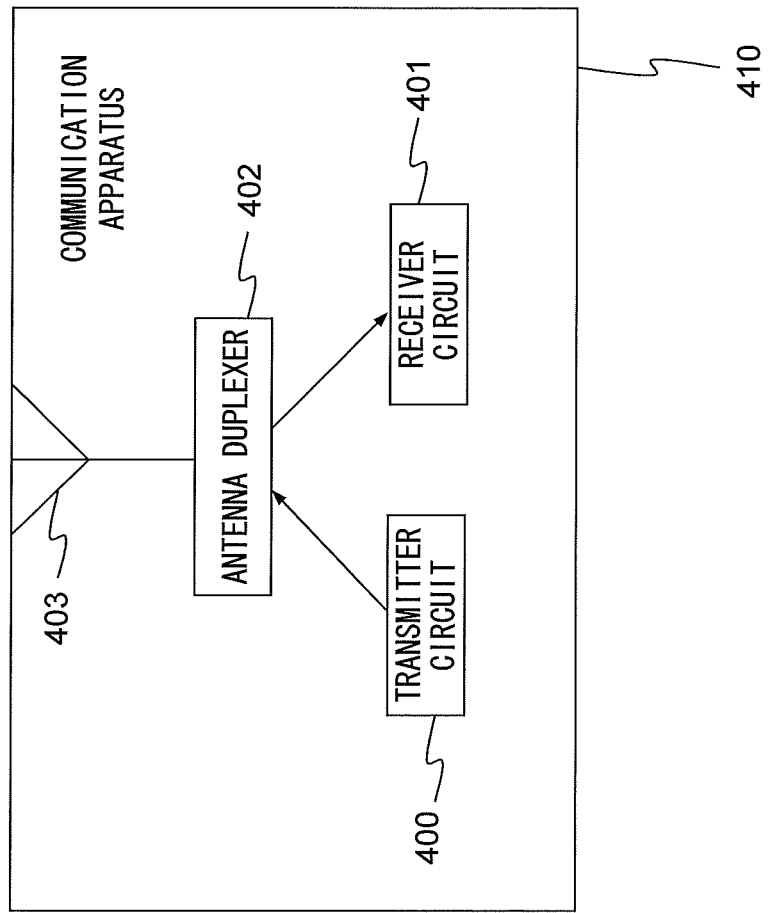
FIG. 17 illustrates a configuration of a communication apparatus according to a fourth embodiment of the present invention.
Figure 18:
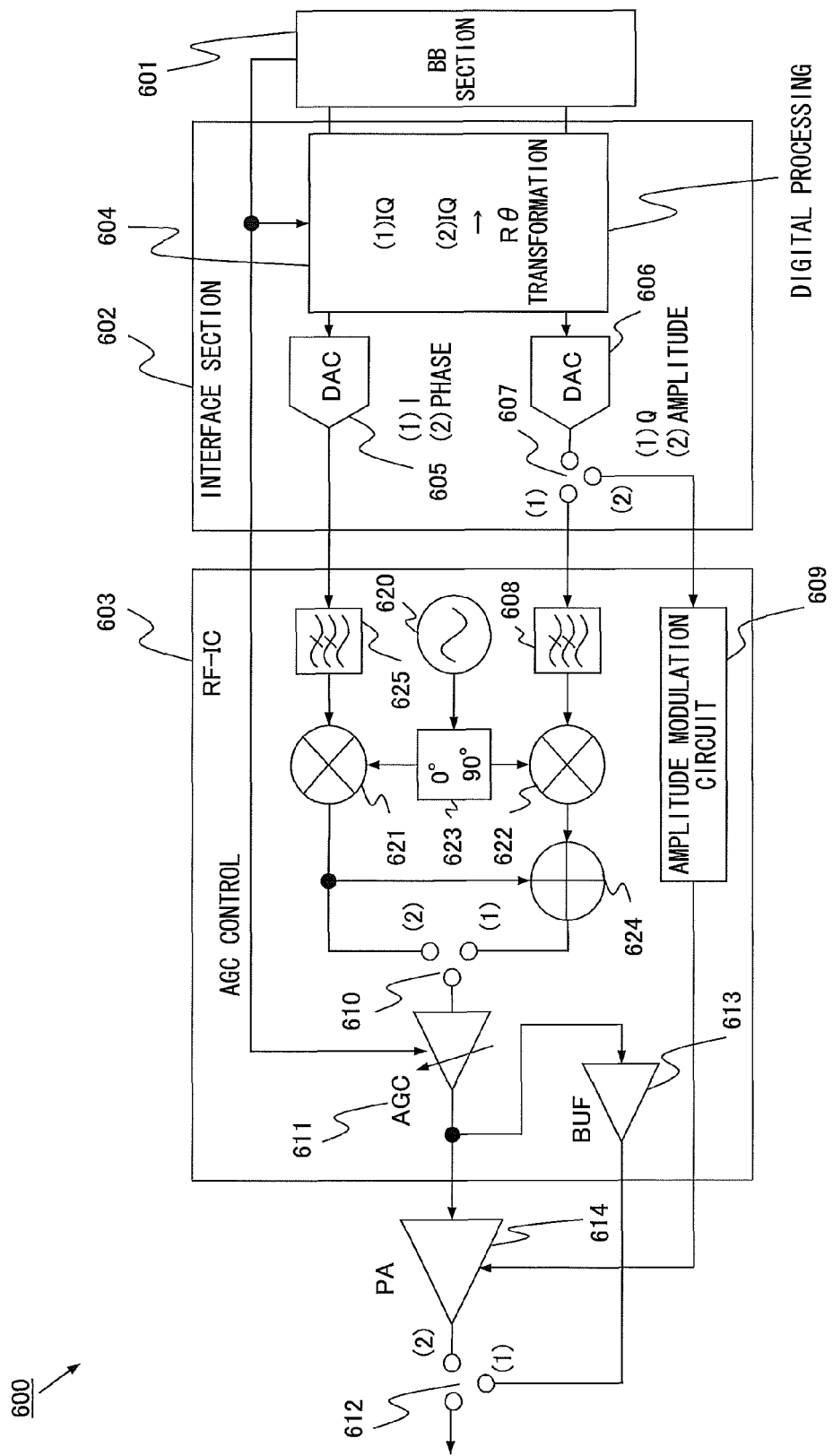
FIG. 18 illustrates a conventional transmitter circuit.

A fourth embodiment of the present invention will be described below. FIG. 17 is a block diagram illustrating an exemplary configuration of a communication apparatus according to the present embodiment. A communication apparatus 410 according to the fourth embodiment includes a transmitter circuit 400, a receiver circuit 401, an antenna duplexer 402, and an antenna 403. The transmitter circuit 400 is implemented as any one of the transmitter circuits according to the first to the third embodiments as described above. The antenna duplexer 402 transfers, to the antenna 403, a transmission signal outputted from the transmitter circuit 400, thereby preventing the transmission signal from leaking into the receiver circuit 401. Further, the antenna duplexer 402 transfers, to the receiver circuit 401, a reception signal inputted from the antenna 403, thereby preventing the reception signal from leaking into the transmitter circuit 400.

Therefore, the transmission signal is outputted from the transmitter circuit 400, and is emitted into space from the antenna 403 via the antenna duplexer 402. The reception signal is received by the antenna 403, and is received by the receiver circuit 401 via the antenna duplexer 402. The communication apparatus 410 may be configured so as to simply include the transmitter circuit 400 and the antenna 403.

As described above, the communication apparatus 410 according to the present embodiment enables reduction of power for transmission to be realized without degrading a quality of the transmission signal when the transmitter circuit according to any one of the first to the third embodiments is used. Further, the transmitter circuit according to the present invention can be used for communication apparatuses such as mobile terminals and wireless LANs.

INDUSTRIAL APPLICABILITY

The present invention is useful for transmitter circuits for use in, for example, wireless communication systems such as mobile telephones and wireless LANs, and is particularly useful for reducing power consumption of the transmitter circuits.

DESCRIPTION OF THE REFERENCE CHARACTERS

100 transmitter circuit
101 signal generation section
102 first synthesizer section
103 second synthesizer section
104, 105, 106, 107 DAC
111 VCO
112 mixer
113 local oscillator
114 FDC
115 TCXO
116 phase comparator
117 charge pump
118 LPF
119 VCO
120 frequency divider
121 mixer section
122, 123 mixer
124 phase shifter
125 adder
126 switch
127 amplifier section
130 power amplifier
131 first temperature calibration section
132 first temperature sensor
133 switch
134 PA driver
151 LUT
152 first calculator
153 variable gain amplifier
154 capacitor
160 control section
200 transmitter circuit
201 second temperature calibration section
202 second temperature sensor
203 second calculator
204, 205 delay unit
300 transmitter circuit
301 third temperature calibration section
302 third temperature sensor
303 third calculator
304 adder
400 transmitter circuit
401 receiver circuit
402 antenna duplexer
403 antenna
410 communication apparatus
600 transmitter circuit
601 baseband section
602 interface section
603 RF-IC
604 Rθ transformation section
605, 606 DAC
607, 610, 612 switch
608, 625 baseband filter
609 amplitude modulation circuit
611 AGC amplifier
613 output buffer
614 power amplifier
620 oscillator
621, 622 mixer
623 phase shifter
624 adder

The invention claimed is:

1. A transmitter circuit that implements two modulation modes which are a polar modulation mode and a quadrature modulation mode, switches between the modulation modes according to an instruction, and generates a transmission signal, the transmitter circuit comprising:

a signal generation section for transforming input data into an amplitude component signal and a phase component signal in the polar modulation mode, and transforming the input data into an in-phase component signal and a quadrature component signal in the quadrature modulation mode, to output an obtained signal;

a first synthesizer section having a first VCO;

a second synthesizer section having a second VCO that consumes less current than the first VCO;

a mixer section; and an amplifier section, wherein the transmitter circuit operates in at least a first operation state, a second operation state, and a third operation state, in the first operation state, a modulation is performed in the polar modulation mode such that the first synthesizer section generates a phase-modulated signal based on the phase component signal, and the amplifier section performs amplification to combine the phase-modulated signal with the amplitude component signal, to generate the transmission signal, in the second operation state, a modulation is performed in the quadrature modulation mode such that the first synthesizer section generates a carrier wave, and the mixer section generates the transmission signal from the carrier wave, the in-phase component signal, and the quadrature component signal, in the third operation state, a modulation is performed in the quadrature modulation mode such that the second synthesizer section generates the carrier wave, and the mixer section generates the transmission signal from the carrier wave, the in-phase component signal, and the quadrature component signal, when an instruction for switching to a quadrature modulation is received in the first operation state, the transmitter circuit shifts to the second operation state, and the second synthesizer section is powered on, and after a predetermined time period has elapsed, the transmitter circuit shifts to the third operation state, and the first synthesizer section is powered off, and when an instruction for switching to a polar modulation is received in the third operation state, the first synthesizer section is powered on, and after a predetermined time period has elapsed, the transmitter circuit shifts to the first operation state, and the second synthesizer section is powered off.

2. The transmitter circuit according to claim 1, further comprising:
a first temperature calibration section for performing a first temperature calibration; and
a first temperature sensor, wherein
the first temperature calibration section stores a calibration value when the first temperature calibration is set to be off, and
the first temperature calibration section starts the first temperature calibration based on the stored calibration value when the first temperature calibration is set to be on.

3. The transmitter circuit according to claim 2, wherein, when the first temperature calibration is set to be on, the first temperature calibration section calculates a new calibration value based on the stored calibration value, and a temperature change which is measured by the first temperature sensor while the first temperature calibration is off, and the first temperature calibration section starts the first temperature calibration based on the new calibration value.

4. The transmitter circuit according to claim 2, wherein
the first temperature calibration is a temperature calibration for a voltage supplied to a VCO,
the first temperature calibration section monitors, while the first VCO is operating, an oscillation frequency of the first VCO, and calibrates the supplied voltage, in order to stabilize the oscillation frequency,
the first temperature calibration section sets, when the first synthesizer section is powered off, the first temperature calibration to be off, and stores the calibration value for the voltage supplied to the first VCO, and
the first temperature calibration section sets, when the first synthesizer section is powered on, the first temperature calibration to be on, and starts a calibration for the voltage supplied to the first VCO by using the stored calibration value.

5. The transmitter circuit according to claim 3, wherein
the first temperature calibration is a temperature calibration for a voltage supplied to a VCO,
the first temperature calibration section monitors, while the first VCO is operating, an oscillation frequency of the first VCO, and calibrates the supplied voltage, in order to stabilize the oscillation frequency,
the first temperature calibration section sets, when the first synthesizer section is powered off, the first temperature calibration to be off, and stores the calibration value of the voltage supplied to the first VCO, and
when the first synthesizer section is powered on, the first temperature calibration section calculates the new calibration value based on the stored calibration value, and the temperature change in the first VCO which is measured by the first temperature sensor while the first synthesizer section is powered off, and starts a calibration for the voltage supplied to the first VCO based on the new calibration value.

6. The transmitter circuit according to claim 1, wherein
when an instruction for switching to the polar modulation is received in the second operation state, the transmitter circuit returns to the first operation state without shifting to the third operation state,
in a case where, after an instruction for switching to the polar modulation has been received in the third operation state and before the transmitter circuit shifts to the first operation state, an instruction for switching to the quadrature modulation is received, the transmitter circuit remains in the third operation state without shifting to the first operation state.

7. The transmitter circuit according to claim 1, further comprising:
a second temperature calibration section for performing a second temperature calibration; and
a second temperature sensor, wherein
the second temperature calibration is a temperature calibration for a signal delay in the amplifier section,
the second temperature calibration section calculates a signal delay calibration value used in the calibration for the signal delay in the amplifier section, based on a temperature of the amplifier section, which is measured by the second temperature sensor, and the second temperature calibration section delays at least one of the amplitude component signal and the phase component signal based on the signal delay calibration value, and the second temperature calibration is set to be on in the case of modulation being performed in the polar modulation mode, and the second temperature calibration is set to be off in the case of modulation being performed in the quadrature modulation mode, and
when the second temperature calibration is shifted from an off-state to an on-state, a new calibration value is calculated based on a temperature change which is measured by the second temperature sensor while the second temperature calibration is off, and the second temperature calibration is started based on the new calibration value.

8. The transmitter circuit according to claim 1, further comprising:
a third temperature calibration section for performing a third temperature calibration; and
a third temperature sensor, wherein
the third temperature calibration is a temperature calibration for an offset characteristic of the amplifier section,
the third temperature calibration section calculates an offset calibration value used in the calibration for the offset characteristic of the amplifier section, based on a temperature of the amplifier section, which is measured by the third temperature sensor, and the third temperature calibration section calibrates a voltage of the amplitude component signal based on the offset calibration value, and the third temperature calibration is set to be on in the case of modulation being performed in the polar modulation mode, and the third temperature calibration is set to be off in the case of modulation being performed in the quadrature modulation mode, and
when the third temperature calibration is shifted from an off-state to an on-state, a new calibration value is calculated based on a temperature change which is measured by the third temperature sensor while the third temperature calibration is off, and the third temperature calibration is started based on the new calibration value.

9. A communication apparatus comprising:
a transmitter circuit for generating a transmission signal; and
an antenna for outputting the transmission signal generated in the transmitter circuit, wherein
the transmitter circuit is the transmitter circuit according to claim 1.

10. The communication apparatus according to claim 9, further comprising:
a receiver circuit for processing a reception signal received via the antenna; and
an antenna duplexer for outputting, to the antenna, the transmission signal generated in the transmitter circuit, and outputting, to the receiver circuit, the reception signal received via the antenna.

* * * * *